United States Patent
McLaughlin et al.

(10) Patent No.: US 6,779,073 B2
(45) Date of Patent: *Aug. 17, 2004

(54) MEMORY DEVICE HAVING A SYSTEMATIC ARRANGEMENT OF LOGICAL DATA LOCATIONS AND HAVING PLURAL DATA PORTALS

(75) Inventors: Robert B. McLaughlin, Arlington, VA (US); Lawrence C. Plumhoff, Greenbelt, MD (US); M. James Bullen, Oakville (CA)

(73) Assignee: Image Telecommunications Corporation, Westport, CT (US)

( * ) Notice: Subject to any disclaimer, the term of this patent is extended or adjusted under 35 U.S.C. 154(b) by 203 days.

This patent is subject to a terminal disclaimer.

(21) Appl. No.: 10/011,775

(22) Filed: Dec. 11, 2001

(65) Prior Publication Data

US 2002/0062420 A1 May 23, 2002

Related U.S. Application Data

(60) Division of application No. 08/249,265, filed on May 25, 1994, now Pat. No. 6,356,973, which is a continuation-in-part of application No. 08/136,185, filed on Oct. 15, 1993, now Pat. No. 5,581,479.

(51) Int. Cl.[7] ............................. G06F 12/00; H04N 7/16
(52) U.S. Cl. ........................ 711/100; 711/110; 711/154; 711/167
(58) Field of Search ............................... 711/100, 110, 711/154, 167; 348/14.01, 571; 745/145

(56) References Cited

U.S. PATENT DOCUMENTS

| 3,713,096 A | 1/1973 | Comfort et al. |
| 3,735,362 A | 5/1973 | Ashany et al. |
| 3,748,647 A | 7/1973 | Ashany et al. |
| 3,812,476 A | 5/1974 | Cragon |

(List continued on next page.)

FOREIGN PATENT DOCUMENTS

EP 0 596 656 A2 5/1994

OTHER PUBLICATIONS

Deloddere et al., Interactive Video on Demand, IEEE Communications Magazine, May 1994, pp. 82–88.
J. Richard Jones, Baseband and Passband Transport Systems for Interactive Video Services, IEEE Communications Magazine, May 1994, pp. 90–101.
W.D. Sincoskie, "System architecture for a large scale video on demand service" Computer Networks and ISDN Systems 22 (1991), pp. 155–162.
C. Scholz, Handbuch der Magnetspeichertechnik, Hanser Verlag, Munich 1980, pp. 64–65.
J.T. Brady, "Bit Interleaving in Electronic Shift Register Store", IBM Technical Disclosure Bulletin, vol. 24, No. 7B (Dec. 1981, pp. 3577–3578.
J. Millman et al., Integrated Elctronics, McGraw–Hill 1985, pp. 632–636.

Primary Examiner—Tuan V. Thai
(74) Attorney, Agent, or Firm—Sughrue Mion, PLLC

(57) ABSTRACT

A memory device that includes a digital storage unit having a data storage unit that stores data in a systematic arrangement, a systematic arrangement of plural data portals each provided for accessing the data locations; a generator that produces systematic, cyclical, relative movement between the data locations and the data portals; and a controller that selects at least one of the data portals in accordance with an input command and a calculation based on the relative movement. When one or more of the plural portals is selected, data can be input or output in a manner which is predictable, straight-forward, free of scheduling constraints, and very efficient, without contention between the separate portals.

5 Claims, 15 Drawing Sheets

U.S. PATENT DOCUMENTS

| | | |
|---|---|---|
| 4,064,556 A | 12/1977 | Edelberg et al. |
| 4,065,756 A | 12/1977 | Panigrahi |
| 4,193,121 A | 3/1980 | Fedida et al. |
| 4,334,305 A | 6/1982 | Girardi |
| 4,363,125 A | 12/1982 | Brewer et al. |
| 4,506,387 A | 3/1985 | Walter |
| 4,792,848 A | 12/1988 | Nussrallah et al. |
| 4,829,372 A | 5/1989 | McCalley et al. |
| 4,975,605 A | 12/1990 | Bazes |
| 5,084,839 A | 1/1992 | Young |
| 5,093,718 A | 3/1992 | Hoarty et al. |
| 5,119,481 A | 6/1992 | Frank et al. |
| 5,357,276 A | 10/1994 | Banker et al. |
| 5,414,455 A | 5/1995 | Hooper et al. |
| 5,440,334 A | 8/1995 | Walters et al. |
| 5,485,197 A | 1/1996 | Hoarty |
| 5,513,011 A | 4/1996 | Matsumoto et al. |
| 5,594,492 A | 1/1997 | O'Callaghan et al. |

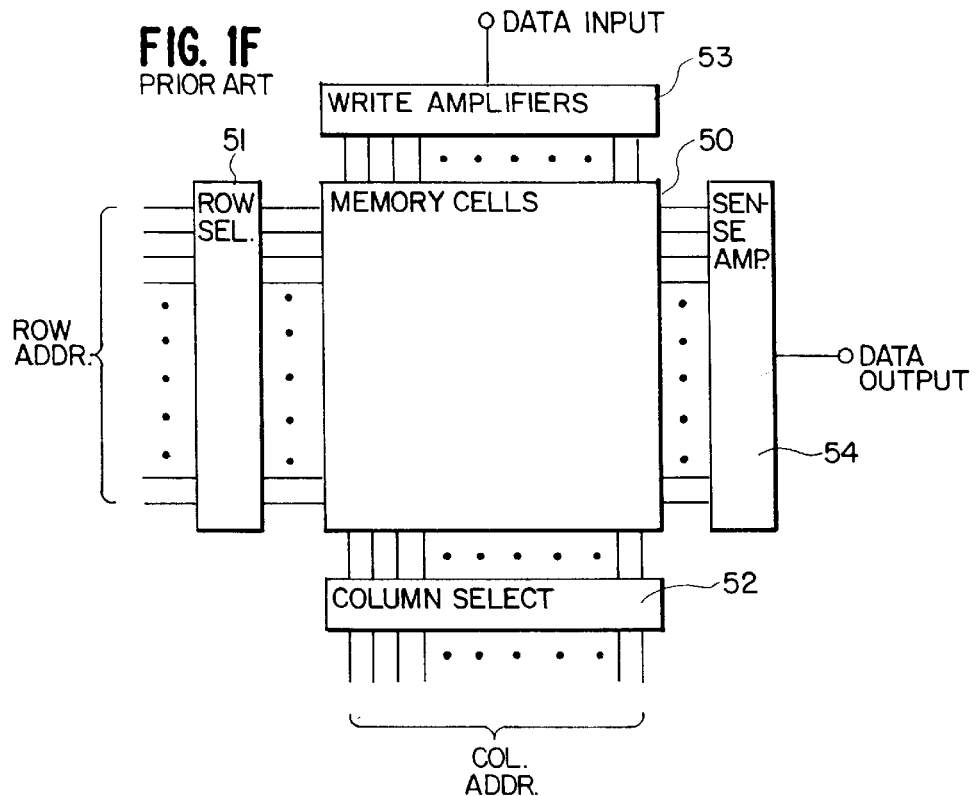
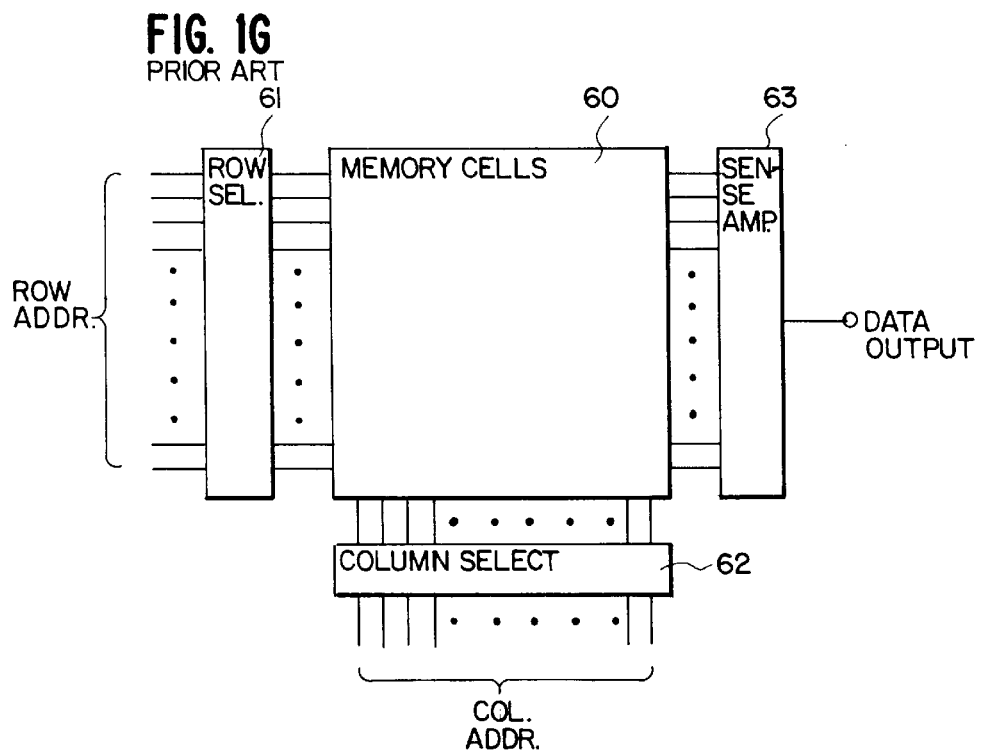

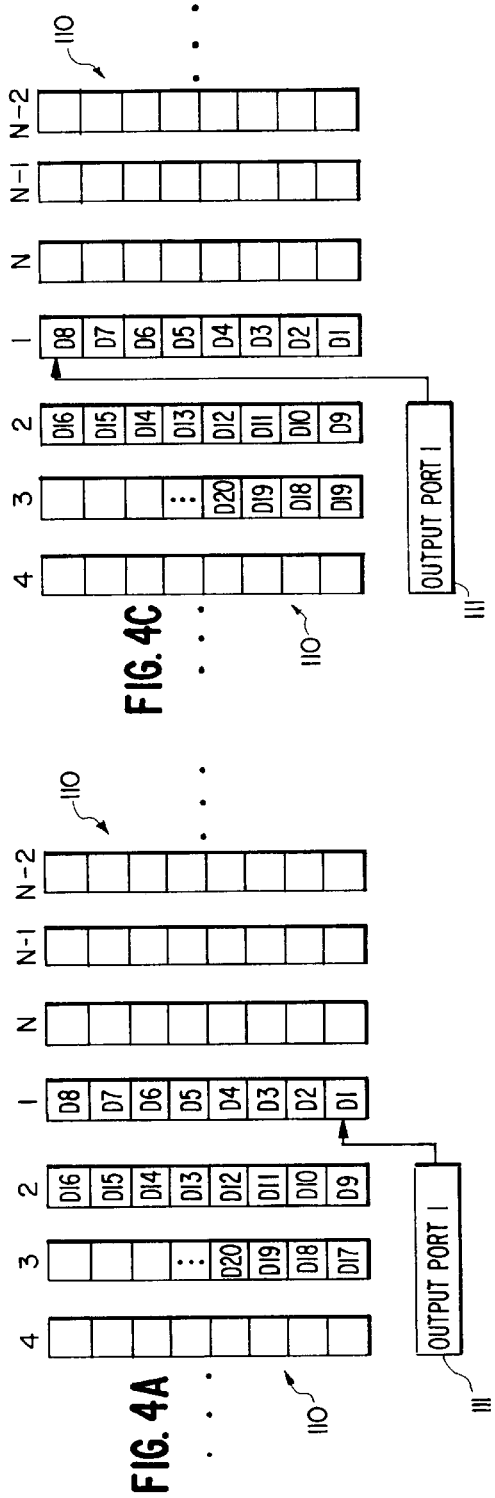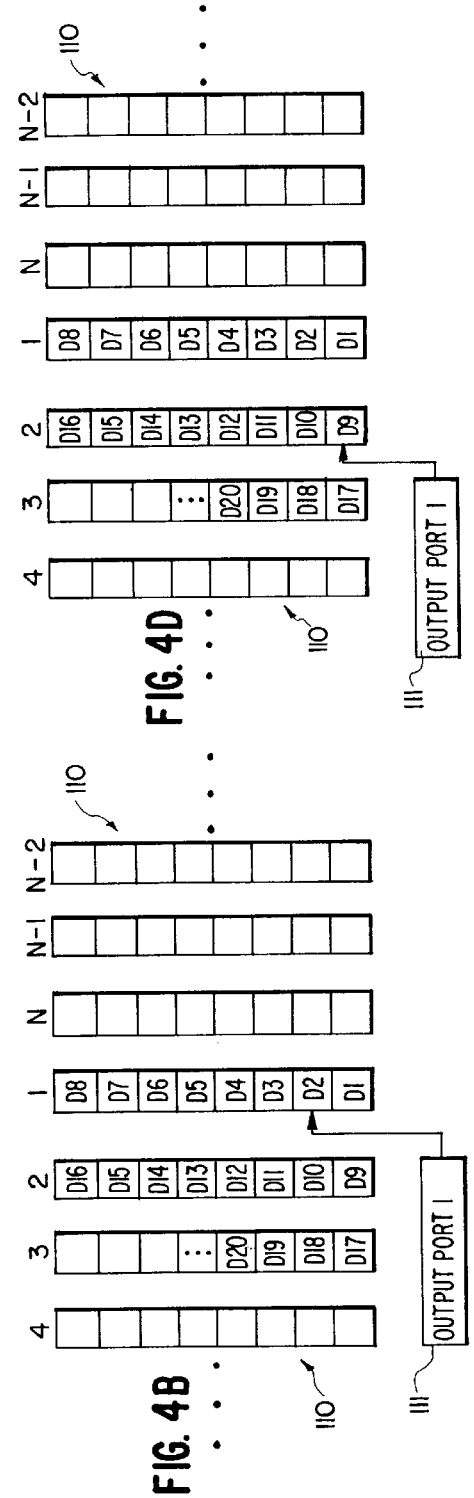

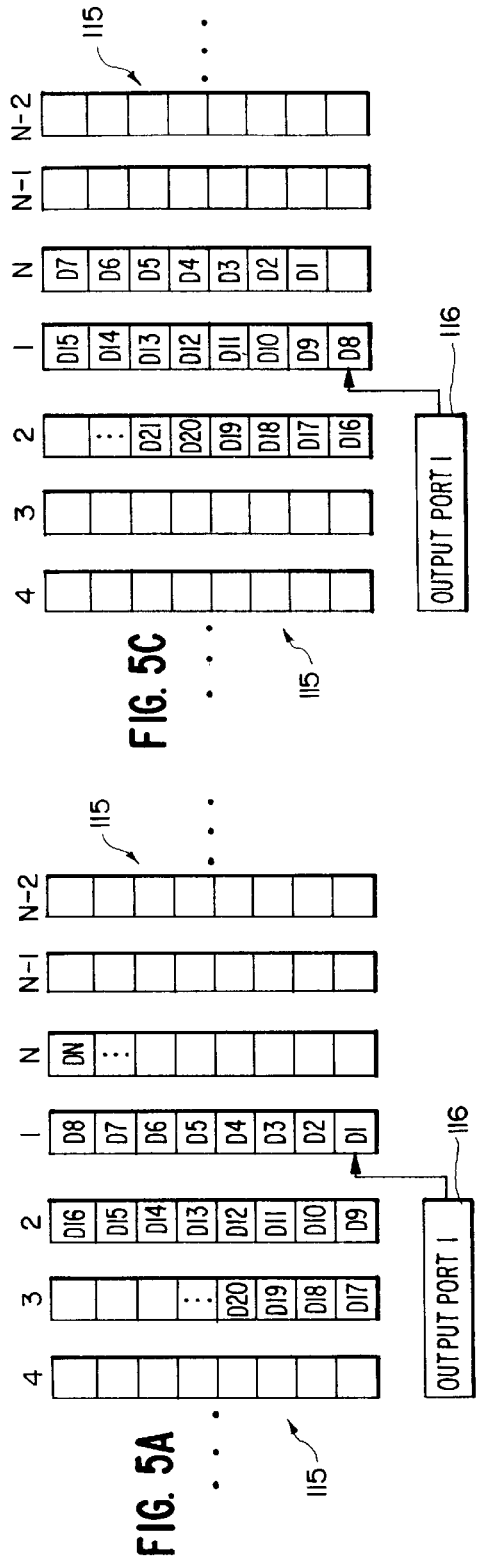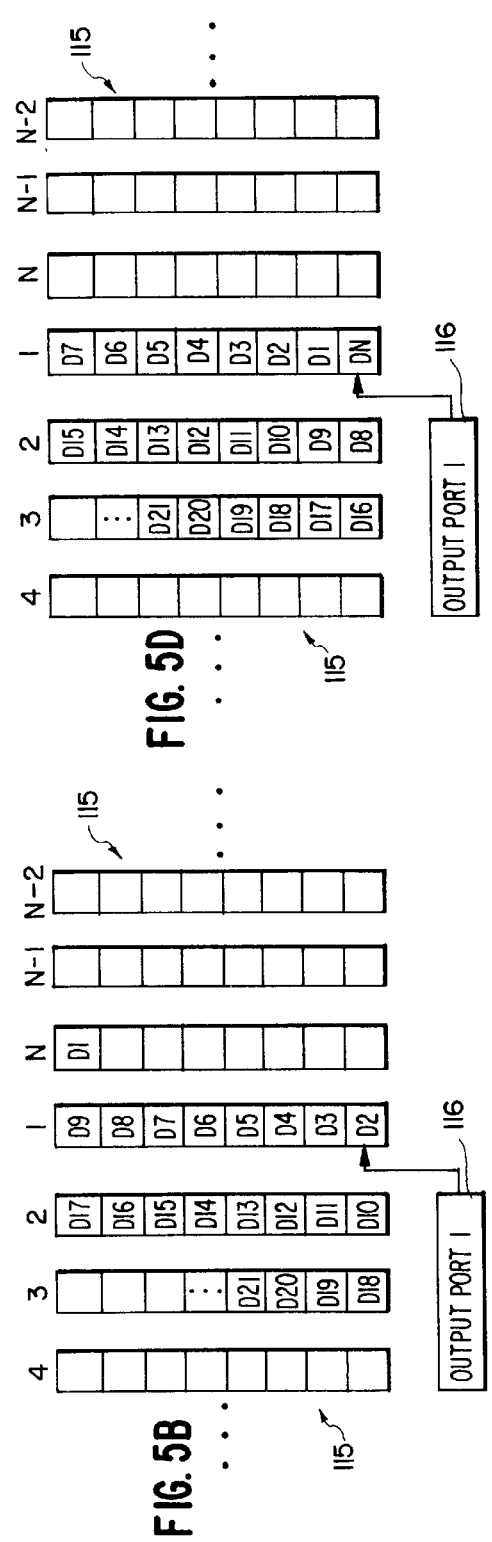
FIG. 5A  FIG. 5B  FIG. 5C  FIG. 5D

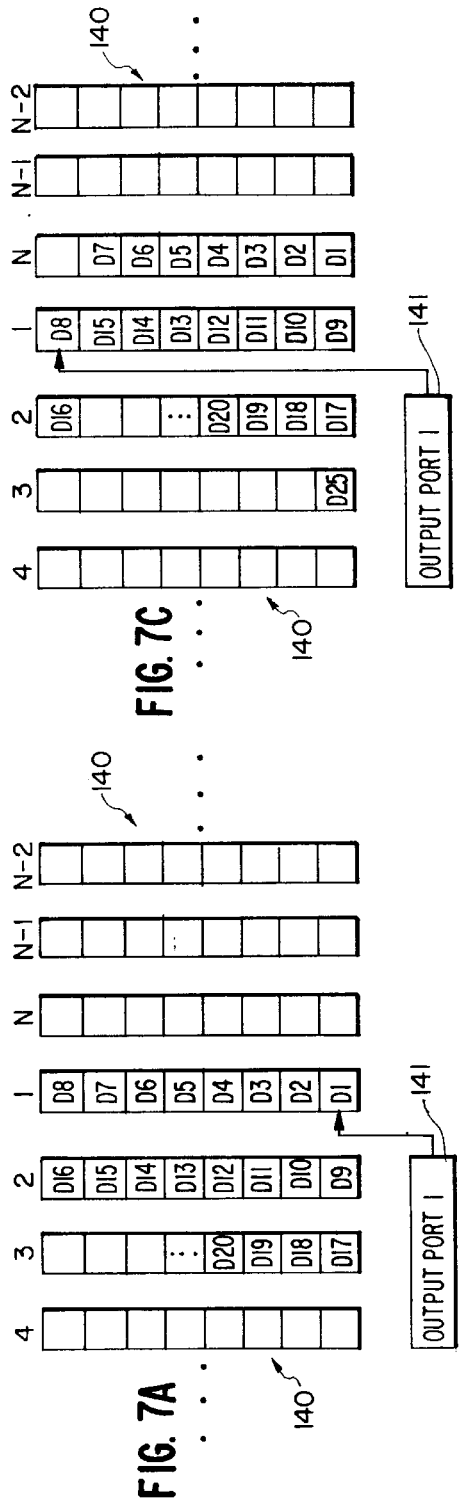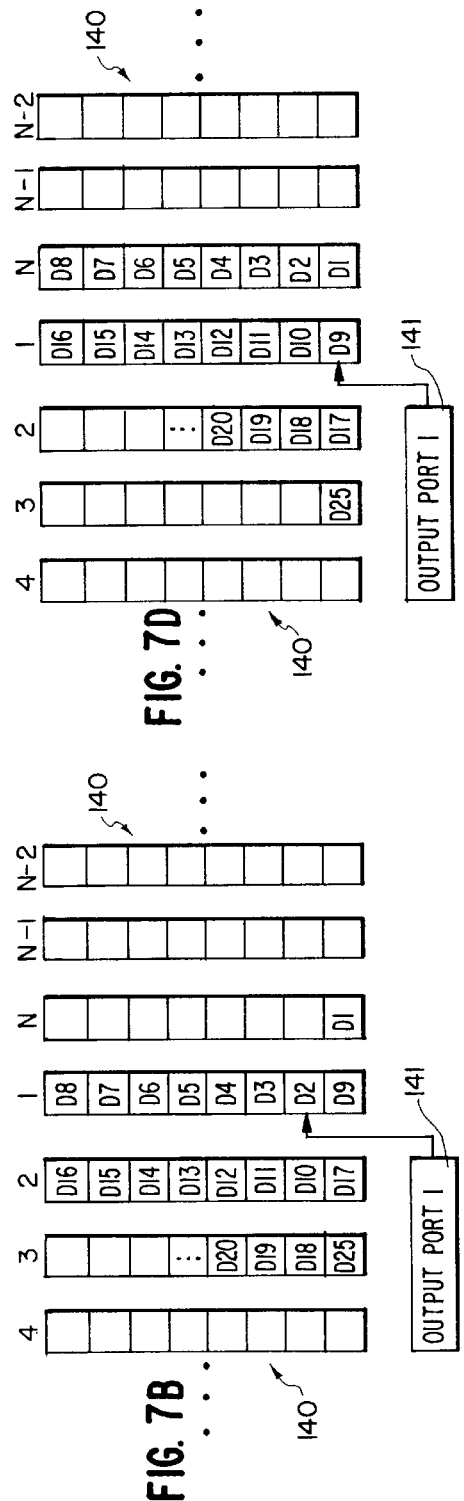

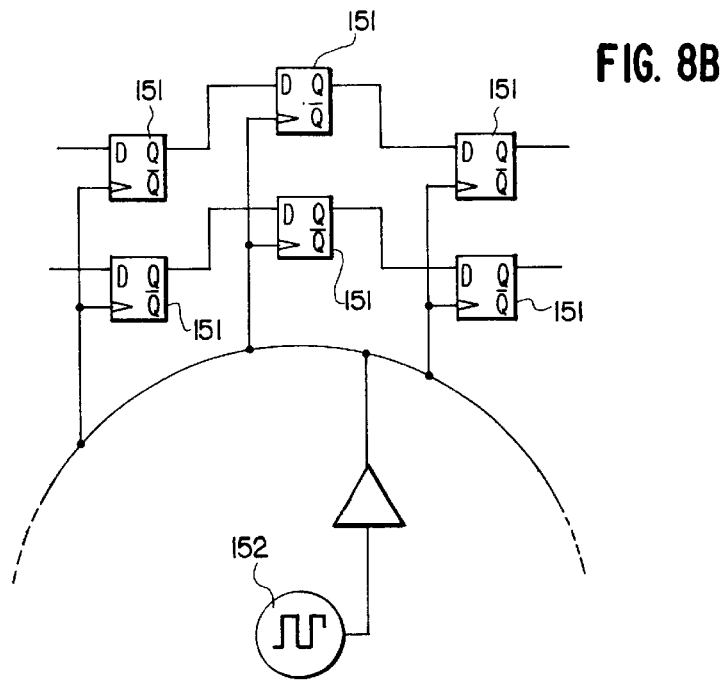

MEMORY DEVICE HAVING A SYSTEMATIC ARRANGEMENT OF LOGICAL DATA LOCATIONS AND HAVING PLURAL DATA PORTALS

RELATED APPLICATION INFORMATION

This application is a divisional of application Ser. No. 08/249,265, filed May 25, 1994, and issued on Mar. 12, 2002, as U.S. Pat. No. 6,356,973, the disclosure of which is incorporated herein by reference. Application Ser. No. 08/249,265, in turn, is a continuation-in-part of application Ser. No. 08/136,185, filed Oct. 15, 1993, and issued on Dec. 3, 1996, as U.S. Pat. No. 5,581,479, the disclosure of which is also incorporated herein by reference.

BACKGROUND OF THE INVENTION

1. Field of the Invention

The present invention relates generally to memory devices and methods of storing and accessing data. More particularly, the invention concerns storage of data in a systematic arrangement of data locations in a manner that establishes a systematic relationship between the data locations and points used for accessing the data, to provide independent and extremely efficient access to, and dissemination of, the stored data streams.

2. Description of Relevant Background

Consumer demand for enhanced on-site entertainment and information services is on the rise. Examples of such entertainment and information services include so-called "on-demand" video, interactive video games, database research, "home-shopping" and the like. Numerous service providers are currently eager to tap this demand, and are therefore expressing interest in schemes for providing such services to consumers.

In order to be economically practical and viable, a system offering the wide range of information-related services just described should preferably be able to (i) store very large quantities of data at an affordable cost per bit; and (ii) provide for efficient retrieval of the data with a minimal contention between users for any portion of the data.

Memory devices according to the present invention are advantageously utilized for storing information (e.g., information in digital or analog form). The types of information capable of being stored can include video and audio information (e.g., movies, video games, television and other entertainment programs), educational information and programs, scientific and other research-related database information, consumer catalog and home-shopping information, and the like, and are hereinafter referenced generically as "information" or "titles".

Many such types of information, in order to be useful, require that the data, which together form the information, are provided in a given sequence or order. Examples include audio information, such as speech or musical compositions, visual information, such as paintings and photographs, and audio-visual information, such as movies, television shows and video games. In the case of a movie, for example, a sequential group of still pictures is connected together on a long strip of photographic film. In order to "play back" the movie, the still pictures are moved past a light source in sequence and at a certain speed, and the resulting images are focused onto a screen while the audio portion of the movie is output over speakers. These resulting images will appear to the viewer to be moving. Similarly, music stored on magnetic tape can be "played back" by moving the magnetic tape serially past a playback head of a tape player.

In analogous fashion, according to more recent techniques, digitally stored data may be stored in a memory and accessed in serial fashion to obtain the same result achieved by the more traditional storage formats mentioned above. As such, an assemblage of stored digital data, if "played back" in serial fashion, can reproduce any of the above types of information. A few of the many types of mechanisms used to store digital data are introduced here just by way of example. They include shift registers, charge coupled devices (CCDs), delay lines, read-only memory (ROM) and random-access memory (RAM).

The shift register as a technology has existed for decades. FIG. 1A shows a typical shift register arrangement. As illustrated, the shift register 10 is composed of a series of D-flip-flops 11. The number of flip-flops provided is variable and depends upon the number of bits N to be stored. In operation, clock pulses input at clock input 12 cause the data at the inputs D to transfer to the outputs Q. This clocking causes data supplied bit by bit at the data input 13 to shift right by one flip-flop. After an appropriate number of clock cycles, the data is output bit by bit at the data output 14.

The shift register illustrated in FIG. 1B is another example of a register, namely a recirculating shift register manufactured by Signetics in 1972. As shown, the shift register comprises an input 20 for data, an input selector 21, a data storage selector 22 composed of logic gates, a shift register 23, a device selector 24, an output selector 25, clock inputs 26, 27, a write control 28, a read control 29, and a data output 30. In operation, the shift register is activated by inputting high signals at the device selector 24. Then, a write enable signal is input to the write control 28, while clock input 26 receives clock pulses. At the same time, the data to be stored is fed to the input 20, thereby inputting the data to be stored. When the write control 28 is changed to low, the data storage selector 22 recirculates the stored data through the shift register 23, thereby storing the data. When it is desired to output the stored data, a read signal to the read control 29 and clock pulses to the clock input 27 trigger the output selector 25 to output the data stored in the shift register at output 30. Since the output operation does not damage the recirculating data, the output operation can be performed repeatedly for the same stored data. To alter the data stored in the register, it must be over-written with new data by a write operation, as described above. The storage capacity for this type of shift register is 512 or 1024 binary digits (bits).

Prior art delay lines, such as the one shown in FIG. 1C, are composed of a silicon substrate 31, a signal input 32, several signal taps 33 spaced equally along the substrate 31, and a signal output 34. An electrical signal entering the delay line at the input 32 propagates through the substrate 31 at a fixed, predetermined velocity. While propagating, the signal passes by each of the several taps 33, which can be used to access the data. Thus, it becomes possible to delay the propagating signal a predetermined amount of time by passing it through the delay line and then selecting an appropriate tap that corresponds to the amount of desired delay. Once the propagating signal reaches the end of the substrate, it is output from the delay line at 34.

FIGS. 1D and 1E show a CCD, where FIG. 1D is a schematic circuit diagram and FIG. 1E is a structural diagram. As shown in FIG. 1D, the CCD is composed of metal oxide semiconductor field effect transistors (MOSFETs) 40 connected in series. Amplifiers 41, 42, also composed of MOSFETs, are provided on the CCD input and the CCD output, respectively. The CCD operates similarly to the shift register (see FIG. 1A) in that a signal enters the CCD at the input 41 and progresses through the CCD from MOSFET to MOSFET in accordance with clock pulses supplied at clock inputs 43 and 44. After proceeding through the series of MOSFETs 40, the signal exits the CCD at output 42. As shown in FIG. 1E, the individual MOSFETs are formed by placing metal contact layers 45 at appropriate locations on a semiconductor substrate 46.

A typical RAM is illustrated in FIG. 1F. As shown in the drawing, an array of memory cells 50 is connected to respective series of row selectors 51, column selectors 52, write amplifiers 53, and sense amplifiers 54. In a data load operation, a particular cell to be written to is selected by providing the cell's appropriate column and row address, using the selectors 51 and 52. The data to be written to that cell is then input to the array 50 via the write amplifiers 53. Given the prior selection operation, however, the data is stored only in the selected cell. Similarly, in a data read operation, a particular cell to be read is again selected by providing appropriate column and row addresses via the selectors 51 and 52. The data is then copied out from the array 50 via the sense amplifiers 54.

FIG. 1G illustrates a typical ROM. The structure is very similar to that of the RAM just described. An array of pre-set memory cells 60 is connected to respective series of row selectors 61, column selectors 62 and sense amplifiers 63. Operation of the ROM proceeds as described with respect to the data read operation of the RAM illustrated in FIG. 1F.

The more traditional (i.e., analog) storage and playback formats suffer from drawbacks both in limitations on dissemination and in scheduling constraints. Thus, traditionally, in order to see a movie, for example, a viewer would have to attend a scheduled showing at a predetermined location. With the advent of broadcasting, the viewer was freed from the need to travel to the showing, but nonetheless was bound by the schedule imposed by the broadcaster. In more recent times, videotape technology has effectively freed the consumer even from the former restrictions on scheduling. However, this additional measure of freedom has given rise to other inconveniences. For example, the consumer must either travel to purchase or rent a particular tape, or program a recorder in order to "time-shift" viewing of a particular scheduled broadcast.

Similarly, data stored digitally in a computer memory also suffers from limitations on access and dissemination. For instance, in an Input/Output operation performed by a computer, the computer must repeatedly perform complex, multi-step operations to access, move and output the desired data in small increments. Also, output using known addressing techniques is a dedicated operation, in that it is limited to one single destination at any given time. As a result, only one end user at a time has access to the output data. Additionally, digital storage of audio-visual information has not been widely practiced, at least in part because the above limitations render it economically unfeasible.

SUMMARY OF THE INVENTION

The memory devices according to the present invention borrow from the above philosophy of outputting data in a serial and sequential manner to convey useful information, e.g., a motion picture. The data output from such a memory device can be used to produce a moving picture or the like from, essentially, sequential frames or their equivalent. Unlike the more traditional media, however, the data is stored in a cyclical, systematic arrangement. In other words, once the data is input into the memory device, the data and some appropriate point of data access will repeatedly coincide. Furthermore, according to the present invention, once the data is input into the memory device, the location of the data can be computed, e.g., by knowing the present or past location of at least some part of the data.

Also, unlike the more traditional media, access to the data is not limited to a single scheduled output. Rather, according to the invention, there can be many output ports associated with one and the same set of stored data. These plural output ports permit independent, simultaneous access to the stored data. Also, these plural output ports can be configured to allow data cloning. Thus, the present invention provides for extremely efficient and powerful methods of data access and dissemination.

It is an object of the invention to provide a particularly useful manner of storing data.

It is a further object of the invention to provide a data storage arrangement and a data retrieval arrangement that permit very efficient access to stored data, with minimal access contention.

It is yet another object of the present invention to provide a data storage arrangement and a data retrieval arrangement that allow the stored data to be disseminated widely and efficiently.

These and other objects are solved by the present invention in its various embodiments. According to one formulation, the present invention provides a method and an apparatus for storing data which:

provide data memory in a systematic, cyclical arrangement;

provide plural data portals in an arrangement defined by modular arithmetic; and provide sequential, relative movement between the data memory and the data portals.

As a result, when one or more of the plural portals is selected, data can be input or output in a manner which is predictable, straight-forward, free of scheduling constraints, and very efficient, without contention between the separate portals.

According to another formulation of the invention, a method and apparatus are disclosed which:

provide data memory in a systematic, cyclical arrangement;

provide a systematic arrangement of plural data outputs; and provide sequential, relative movement between the data memory and the data outputs.

Again, when one or more of the plural outputs is selected, data stored in the data memory can be tapped in a manner which is predictable, straight-forward, and very efficient, without scheduling constraints and without contention between outputs.

The memory devices of the present invention can be designed in several different ways, as long as linkage between data and portals is assured. But it is not material how such linkage is achieved. For instance, according to one design, the memory device circulates data either through or past fixed portals. According to another, the data is stored in fixed address locations and the portals are moved from address to address. These and other alternative designs will be discussed in greater detail below in the Detailed Description.

Preferred embodiments of the invention utilize semiconductor memory technology in order to implement the memory devices. Various such semiconductor solutions are described below in the section entitled "Specific Embodiments of the Invention". Another set of embodiments, also described below, utilizes memory storage media capable of confining propagating waves in order to implement the memory devices.

BRIEF DESCRIPTION OF THE DRAWINGS

Preferred embodiments of the invention are described, by way of example, with reference to the accompanying drawings, in which:

FIGS. 1A–1G show various data storage techniques known in the prior art;

FIGS. 4A–4D show one embodiment of the arrangement of FIG. 3;

FIGS. 5A–5D show one embodiment of the arrangement of FIG. 2;

FIGS. 7A–7D show one embodiment of the arrangement of FIG. 6;

FIGS. 8A–8E show embodiments of the present invention constructed using shift register technology;

DETAILED DESCRIPTION OF THE PREFERRED EMBODIMENTS

I. Principles of the Invention

A. Structure

Figure 2:
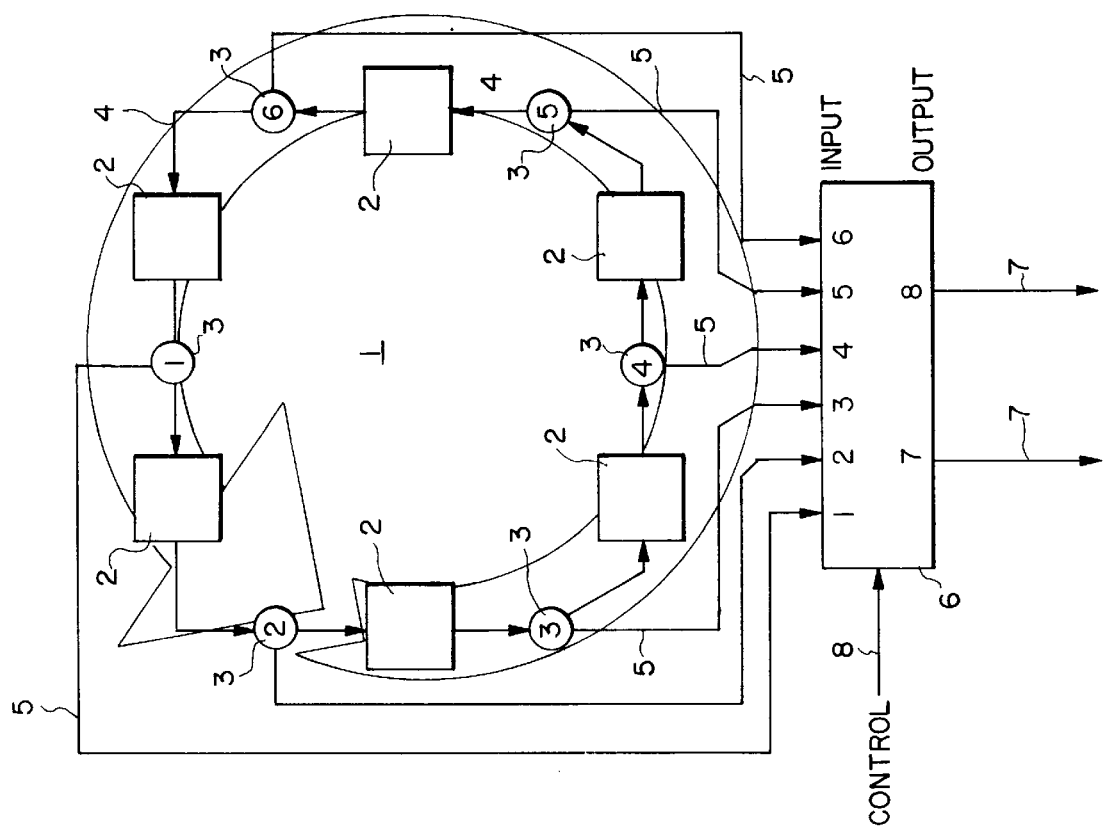
FIG. 2 illustrates a memory device according to the present invention, which, in this embodiment, is fashioned as a ring memory device.

FIG. 2 shows a memory device that is capable of storing data information, i.e., titles of various sorts. The device is constructed of a plurality of data storage devices 2, together forming a storage unit 1, and a plurality of portals 3. The portals 3 are dispersed around the storage unit 1 in a manner that can be described by means of modular arithmetic. As indicated by the directional arrows superimposed on signal paths 4, the memory device is configured to establish relative movement between data stored in the storage unit and the portals 3.

Preferably, the storage devices 2 are arranged in the storage unit 1 in series fashion to form a circulating structure. This structure can take the form of an endless loop or ring, as shown in FIG. 2. The specific form chosen, however, is not particularly important, as long as the structure is systematic and provides a predictable arrangement of storage devices 2. Preferably, the arrangement of storage devices 2 is defined in accordance with modular arithmetic. Modular arithmetic will be explained below, in conjunction with the detailed discussion of the portals 3.

FIG. 2 shows six storage devices 2 connected into the ring structure. (As will become more apparent below, the number of storage devices 2 in an actual, commercial embodiment would be far greater than this. Only six are shown in order to render description of the invention simpler and clearer.) As will be discussed in descriptions of various implementations, below, the storage devices 2 can be selected from a wide variety of existing technologies. Currently, the most preferable hardware options are various types of semiconductor memory, e.g., shift registers, delay lines, CCDs, RAMs, ROMs and non-volatile memories of various types. Advances in technology will surely expand the list of available options.

The portals 3 are connected to the storage unit 1 at various locations. In FIG. 2, the portals 3 are connected into the ring and alternate with storage devices 2. However, as with the storage devices, the particular form of connection is not important to the invention. Rather, it is important that the portals 3 are arranged in a systematic and predictable manner, and that they are configured to allow data to enter or exit (or both enter and exit) the storage unit.

As noted above, the arrangement of portals 3 is defined by modular arithmetic. Modular arithmetic, as defined by Merriam-Webster Inc., is the "arithmetic that deals with whole numbers where the numbers are replaced by their remainders after division by a fixed number." By way of example, since the hours in a day are also defined by a modular arithmetic, 6 hours after 9 o'clock is 15 o'clock, but is also 3 o'clock, because clocks follow a modular arithmetic with modulus 12. Stated in the form of an equation, the arrangement of portals 3 is defined as follows:

$$P_i = P_{i+M},$$

where Pi=any chosen data portal in the arrangement, and
M=the total number of data portals 3 provided in the storage unit 1. FIG. 2 shows a storage unit provided with M=6 data portals 3. (Again, a commercial embodiment would most likely contain many more than six portals.) Thus, the seventh data portal 3 is equivalent to the first data portal 3.

The relationship between consecutive data portals can also be described mathematically, as follows:

$$P_{i+f(t)} = P_{i+1},$$

where Pi=any chosen data portal in the arrangement,
Pi+1=the next data portal relative to Pi, and
f(t)=a function of time. It should be noted that, given the non-continuous nature of hardware implementations, f(t) should not be construed as being limited to a smoothly continuous function, but includes rational number (e.g., integer) approximations of continuous functions. Preferably, $$f(t) = C,$$

where C=a constant. When f(t) is constant, the portals 3 are arranged around the storage unit 1 at fixed, regular intervals, as illustrated in FIG. 2. The benefits of having constant intervals between portals include the ability to construct the ring and, in particular, the portals, of pre-fabricated, modular units (other benefits are described later in the application). The intervals need not be constant, however, to provide an operable and practical memory device 1. For example, dispersing the portals 3 according to the function:

$$f(t) = \log(t)$$

causes the intervals between portals to become progressively longer until the loop returns to the initial portal. The function:

$$f(t) = \sin(t)$$

Arranging the portals according to modular arithmetic renders access to data stored in the memory device calculable and reproducible. The benefits of the systematic nature of the arrangement will become apparent below.

The portals 3 shown in FIG. 2 are each constructed as data replicators, such that, if selected, each portal performs both a replicating and an outputting function. This is indicated by the arrows shown on each of the signal paths 4 and 5 emanating from each portal 3. The arrows on signal paths 4 indicate data that continues circulating in the ring. The arrows on output signal paths 5 indicate data which is output from the ring. This is the preferable arrangement. Alternatively, the memory device can be constructed with non-replicating portals 3 and separate data replicators (not shown), which merely replicate the data stored in the device 1 but do not output it from the ring. Examples of hardware that can be used as portals 3 include latches, logic gates, regenerators and amplifiers.

Although not specifically shown in FIG. 2, the memory device includes a means which forces portals 3 and data stored in the storage unit 1 to move relative to one another. Conceptually, it does not matter whether the data moves and the portals remain static, or whether the portals move while the data remain static (or, for that matter, whether both the portals and the data move relative to some third point of reference). The arrangement shown in FIG. 2 is one in which the data move and the portals 3 are fixed.

Generally, in digital arrangements, the means which establish the relative movement would be embodied by some form of clocking mechanism. Types of clocks easily adapted to a memory device according to the present invention include n-phase clocks, timing generators, address generators, data multiplexers, and microprocessors.

Finally, FIG. 2 shows a controller 6 connected to the storage unit 1. Specifically, the controller 6 is connected via signal control lines to respective portals 3. The controller 6 is configured to control data traffic at the portals 3, e.g., by selecting among data portals 3 in accordance with an externally supplied control signal 8. Data traffic includes either the input of data into the storage unit 1 via the portals, or the output of data from the storage unit 1 via the portals. As such, the controller 6 establishes and regulates connections between the data portals 3 and signal lines 7. The signal lines 7 in FIG. 2 are indicated by the arrows as being output lines that transport replicated data out from the unit 1. However, the signal lines 7 can also be used for inputting data into the unit 1.

B. Operation

In operation, the memory device is utilized for inputting data, for storing data and for outputting data. These three aspects will now be described in turn.

In an input operation, data to be stored is presented to some portal 3 in the ring, e.g. portal number 1. Once the portal number 1 is activated, the data is fed into the storage unit via the portal number 1 preferably as a sequential data stream. Any data previously existing in the ring is thereby over-written. The input operation is completed when all of the data desired to be stored has entered the storage unit 1 via the portal. Thus, for example, if one wishes to store data corresponding to a movie title in the memory device, according to one straightforward model, the data is input in serial fashion, starting with the beginning of the movie and ending with the data corresponding to the closing credits. If desired, the data may be input in a time-division multiplexed or space-division multiplexed manner. This can be achieved, for example, by selecting more than one portal, e.g., the portals numbered 1 and 4, at predetermined relative times, for example, simultaneously.

The controller 6 can, but need not, be used during the input operation. If the controller 6 is used, the controller 6 selects one of the signal lines 7 and one of the portals 3, and controls the input of data from the selected line 7 to the storage unit 1 via the selected portal 3. If the controller 6 is not used, an input line is simply connected directly to one or more portals 3 during the input operation.

Once the data is input, the ring stores it in a cyclical arrangement. A cyclical arrangement is one in which, even though, en route, the data may be processed (e.g., error-corrected, error-proofed, modulated, encoded, decoded, encrypted, decrypted, etc.), branched, diverted, or otherwise acted upon, eventually, the data (or an appropriate facsimile or correlate thereof) and an appropriate point (such as a portal) in the memory structure will again coincide. Several variations are possible. For example, the point in the memory structure may be stationary, while the data is kept in motion. Conversely, the data can be held fixed while the point in the memory structure is moved. Also, both the data and the points can be moved, relative to some third position of reference. Embodiments employing each of the above variations will be described in greater detail later in the specification.

FIG. 2 shows a cyclical arrangement of stored data in which the data moves relative to fixed portals 3. More specifically, the data circulates in a ring structure, passing from one storage device 2 to the next, and so forth. If the portals 3 are connected into the ring, as shown in FIG. 2, they pass the data from one storage device 2 to the next during storage but otherwise remain passive. Alternatively, the portals 3, equally well, can be appended onto the ring, such that, during storage, the data stream passes directly from one storage device 2 to the next without passing through the portals 3.

The fidelity of the stored data is maintained while the data circulates in the ring. As such, the data circulates in the same order in which it was input into the ring. Thus, if the ring has been loaded with data corresponding to a movie title, the movie title data circulates continuously through the ring, head following tail. As viewed from a specific point on the ring (e.g., some given portal 3), the data repeatedly passes by in the fashion in which it was loaded. The rate of circulation is determined by the frequency of the clock used by the memory device, as described above. The clock can also be used to alter the rate of circulation, if desired. For instance, it may be desirable to provide an arrangement wherein the relative movement between the stored data and the data portals is intermittent rather than continual. Applications conducive to intermittent data progression include video games and electronic catalogs. Movies, television programs, music and the like are preferably stored using continual (i.e., uninterrupted) data movement.

When it is desired to output data that is stored in the memory device, first, one of the portals 3 is selected by the controller 6 as commanded by the control signal 8. Also, one of the signal lines 7 is selected as an output line. The output operation then preferably proceeds by reproducing the stored data at the selected portal and delivering the reproduced data to the selected output line 7, so that the data may be routed to an appropriate destination. No further control is needed; once the appropriate portal is selected and the output operation commences, the stored data stream simply "flows out", i.e., is reproduced and delivered as it passes the selected portal. The output rate simply matches the rate of circulation of the data within the ring (assuming the portals operate at real time). When the complete data stream has been output from beginning to end, in appropriate circumstances, the controller 6 may sever the connection between the selected portal 3 and the selected output line 7. Of course, during the described operation, non-selected portals simply pass the data within the ring, without reproducing it, on to the next storage device 2, as described above.

The decision of which portal to select is governed by the momentary, current location of the stored data stream relative to the portals 3. For instance, if the stored data represents a movie title or television program, and it is desired to output it from its beginning, a portal is selected which lies an appropriate distance downstream of the current location of the beginning of the title/program. The momentary, current location can be calculated, given the predictable arrangement of the portals around the ring and the known rate of circulation of the data (or comparable parameters).

Specifically, given the described structure, it is possible to construct appropriate functions to calculate the portal to be accessed. Such functions, which would be apparent to those skilled in the art, can determine the portal to be accessed based, e.g., on the portal that was used to load the data, the time elapsed from loading, and the speed of propagation of the data. If, as described above and as shown in FIG. 2, the intervals between portals are constant, i.e., f(t)=C, the calculation is especially simple.

Of course, variations more complicated than the ones just described, which utilize more complex arrangements of portals and/or data storage, are possible. Such functions, even though more complex, nonetheless operate according to the same principle, and are covered by the present invention.

The ability to compute a desired portal relative to data is a feature of the invention which is not characteristic of outputs of standard electronic devices (e.g., prior art shift registers, delay lines, CCDs, and so forth). As such, the calculated portal number assumes a quality more commonly associated with an Input/Output operation performed by a computer. However, unlike an I/O operation, a single computation provides access to an entire stream of stored data, not just one data unit. Further, the provision of plural data portals permits overlapping output sequences not achievable by standard I/O operations. Finally, this feature also distinguishes the present invention over known information distribution systems, such as local area networks (LANs, e.g., Token Ring, Ethernet), wide area networks (WANs), metropolitan area networks (MANs), and cable television systems. In these systems, calculation of a portal has no relationship with input/output operations. Rather, these systems require cumbersome scheduling, addressing and routing schemes, to permit users to find and access data in the system.

In a practical operation of the memory device, plural data portals would normally be active in outputting data at any one time. Thus, in a typical operation, a first data portal 3 (e.g., data portal number 6) is selected for outputting the data at a first moment in time. The controller 6 controls the output such that the data is replicated and routed out from the storage unit 1, via a first selected output line 7, to a desired first end-user destination. The selected output line 7 thus carries the data, e.g., movie title, television program, etc., out in its sequential order as a first data stream. Thereafter, if a second end-user destination requests the same data, the controller 6 again calculates which portal should be selected for outputting the data at the second moment in time. The controller 6 then replicates and routes the data as a second data stream from the second selected data portal (e.g., portal number 2), via a second output line 7, to the second end-user destination.

If the above-described calculation again happens to yield data portal number 6, preferably, the calculation would provide for selecting the next available portal, here portal number 1. Given the large number of portals and short time delays between portals in an actual embodiment, the end user would not perceive the resulting delay. For instance, in a working embodiment, the time delay defining intervals between consecutive portals might be chosen to be, e.g., anywhere between 5 minutes, the best estimate of current human patience, and ⅓₀th of a second, the current refresh rate between television frames. The intervals between portals would be determined primarily by balancing grade of service with cost of the service.

Since the stored data is replicated at each selected portal, and the portals operate independently, there is no requirement that output of the second data stream be delayed until the first data stream has been completely output. In other words, the data streams being output may be staggered, i.e., partially overlap. As a result, in the arrangement of FIG. 2, even though only one copy of the title is stored in the unit 1, the title could be output to six different end-user destinations at once if the portals were each activated one after another.

Furthermore, the signal lines 7 may be controlled in such a way that one given data stream branches to multiple end users. As such, the number of staggered "playbacks" of the stored title is further increased by providing simultaneous playback to different end-user destinations of any or all of the staggered "playbacks".

As apparent from the explanation above, since the data stored in the memory device can be output as a large number of independent output data streams, the present invention provides an extremely powerful method of accessing data. Further, since the data streams (accessed as described and further cloned if desired) can be routed to a practically unlimited number of customers, the present invention provides an extremely efficient method of data dissemination.

C. Alternative Structures

The design of the memory device described above implies that digital information will be circulating in a loop and that portal locations are fixed at given locations on the loop. According to the invention, however, it does not matter whether the data moves and the portal location is static, or the portal location moves and the data is static (or whether both move relative to a third chosen location). All these alternative designs perform the required functionality of a memory device.

As evident from the alternatives discussed below, the manner of storing and accessing data (preferably representing video and/or audio information) according to the present invention is amenable to a variety of designs. FIGS. 3 and 4A–4D inclusive illustrate the moving output ports (address) design. FIGS. 2 and 5A–5D illustrate the moving data alternative. FIGS. 6 and 7A–7D inclusive illustrate movement of both the ports and the data.

C1. First Alternative: Fixed Data, Moving Portals

Figure 3:
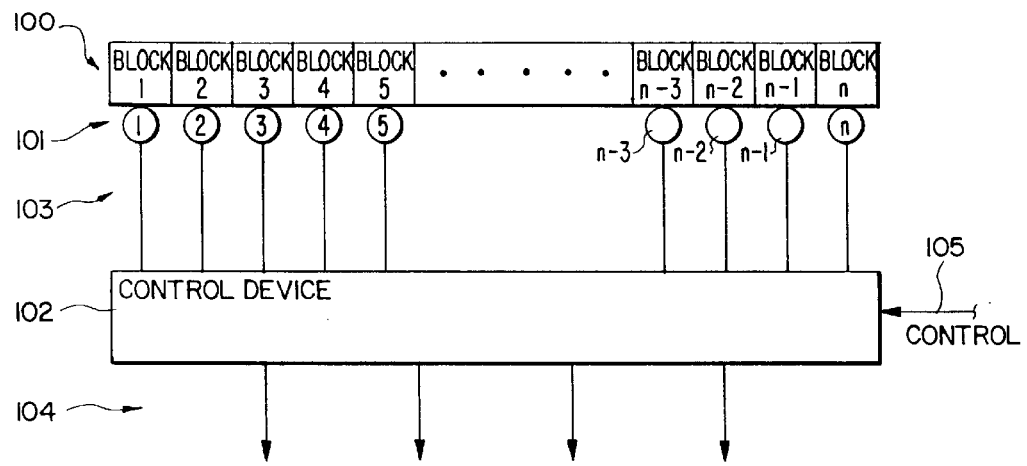
FIG. 3 shows a first alternative structure, in which fixed data are accessed by moving portals.

FIG. 3 shows an alternative where the data forming a title 100 is held fixed in time in a data memory. As shown, the title 100 is subdivided into numerous individual blocks 1 to n and stored. Each block is a sequential segment of data. Preferably, each block of data is associated with one portal

101. FIG. 3 also shows a control device 102, which is used to select data blocks by activating appropriate portals 101.

During an output operation, the control device 102 activates the portal 101 associated with data block 1. The data in block 1 travels via signal line 103 to the control device 102, which transfers data block 1 to an output line 104. When data block 1 has been successfully output, the control device 102 will cause the next portal 101 in the sequence to be read. In this case, it is the portal associated with block 2. In this manner, the control device will activate one portal after another, such that the output portal being activated changes with time. As such, the data stored in the data memory is held fixed, while the portals used for accessing the title data move.

In more concrete terms, FIGS. 4A–4D show an implementation of the fixed data, moving portals alternative. FIG. 4A depicts a group of "N" memories 110. Each memory has a capacity of eight cells (a cell being any arbitrary amount of data). The configuration of data relative to output port 1 (see reference number 111), shown in FIG. 4A, corresponds to a reading operation of the data D1 held in the first cell of the first memory 1. FIG. 4B shows the results as the second piece of data D2 held in the second cell of memory 1 is being read. This process continues until the data D8 in the eighth cell of memory 1 is read, as shown in FIG. 4C. Before the next piece of data is read, the "pointer" in the column of cells is then reset to the position associated with the first cell. Additionally the output port 1 is moved to the "next" memory 2. This is shown in FIG. 4D. This process continues until the fall data stream has been accessed and output. Once the "last" piece of data is output, the output port 1 is again free to be reset to the initial memory cell location and to commence reading the data stream D1–DN from the beginning. If the memory structure is fully utilized, the "last" piece of data DN should be stored in cell number 8 of memory N. However, the "last" piece of data may be held in some previous location in memory, for instance, cell 3 of memory N-1.

Referring back to FIG. 3, the control device operates according to a programmed sequence defining the sequence in which the portals 101 are accessed. This programmed sequence can be determined by an external control signal 105 or can be stored internally in the control device itself. If stored internally, the external control signal 105 may still be used, e.g., for selecting between several different stored sequence programs.

The data memory used in this alternative can be any of a number of memory storage devices including dynamic RAM, static RAM, and pseudo static RAM. Further, there is no limit on the size of a data block. For example, one data block, as shown in the figure, can represent a complete RAM, a sector in RAM or even just a bit. The portals 101 can be constructed from logic gates, gate arrays, programmable logic arrays, etc. The control device 102 can be made from a number of devices including logic gates, gate arrays, microprocessors, and sequencers.

C2. Second Alternative: Moving Data, Fixed Portals

In illustrating the principle of the invention, FIG. 2 showed one memory arrangement in which moving data is accessed by fixed portals. FIGS. 5A–5D show one possible implementation of the moving data, fixed portals alternative. FIG. 5A shows the configuration of title data 115 relative to output port 1(see reference numeral 116) when the data D1 held in the first cell of the first memory 1 is being output. After the first piece of data D1 is read, the data D1–DN are transferred, as shown in FIG. 5B, such that the next piece of data D2 can be read. FIG. 5C shows the data position once eight read operations have occurred. FIG. 5D shows the relative position of the data to the output port 1 while DN, the final piece of data in the data stream, is being read.

C3. Third Alternative: Moving Data, Moving Portals

Figure 1A:
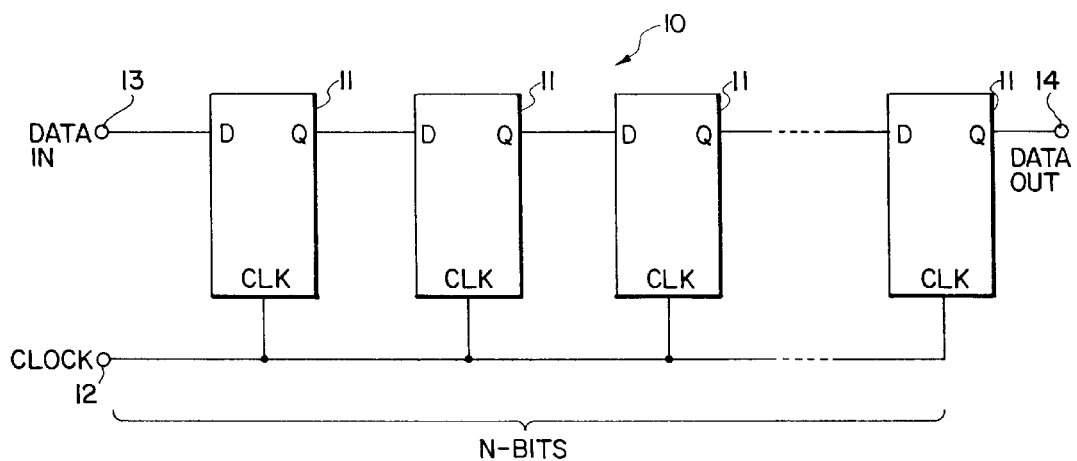
Figure 1B:
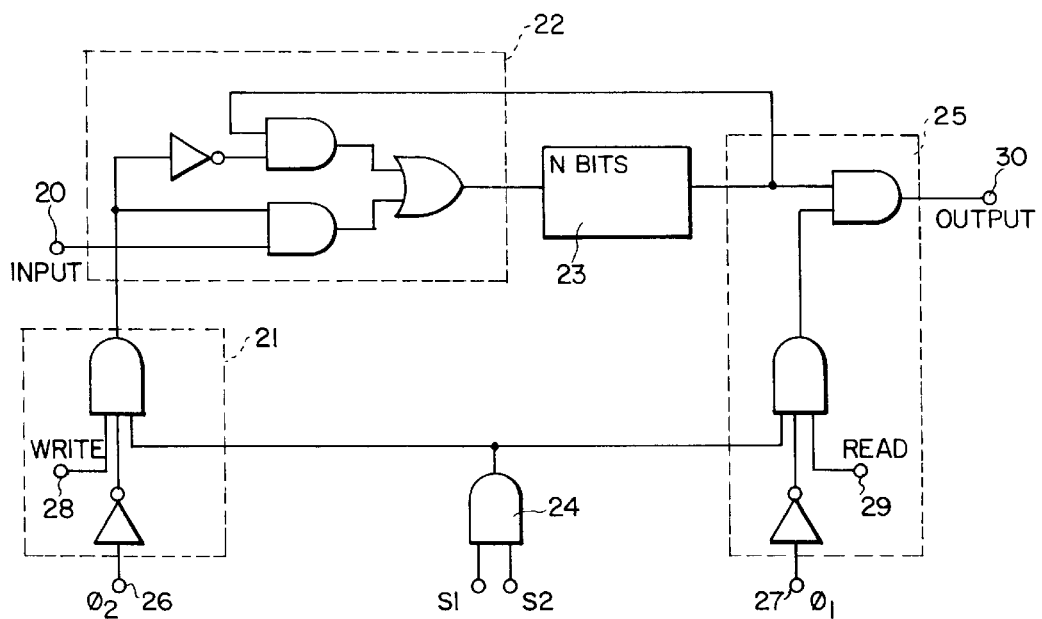
Figure 1C:
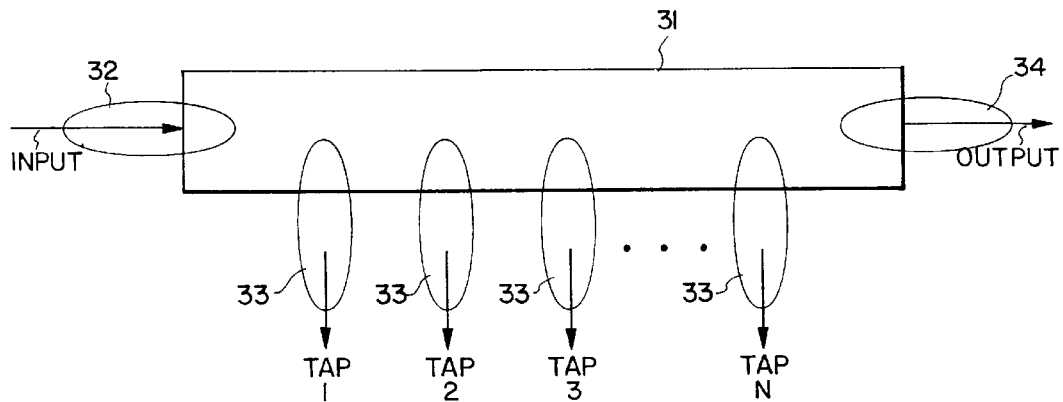
Figure 1D:
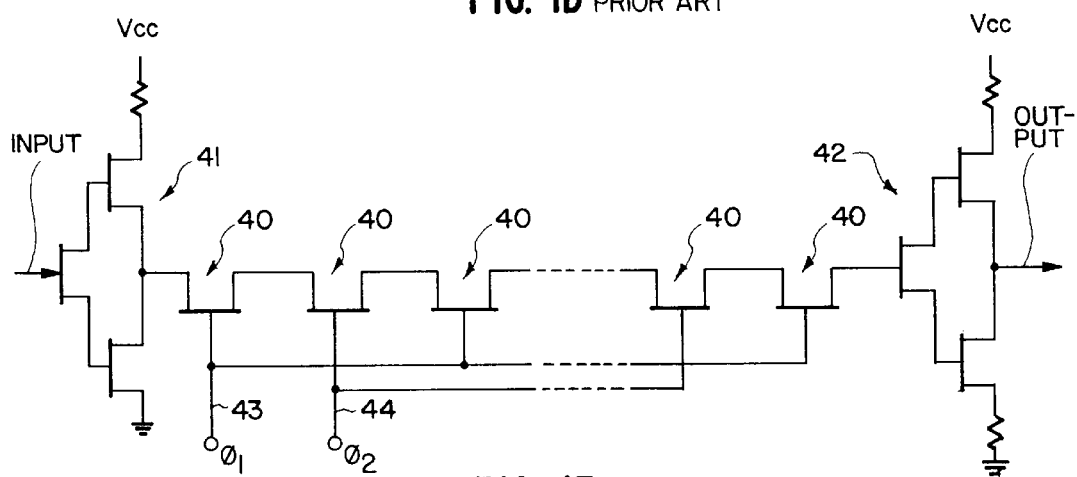
Figure 1E:
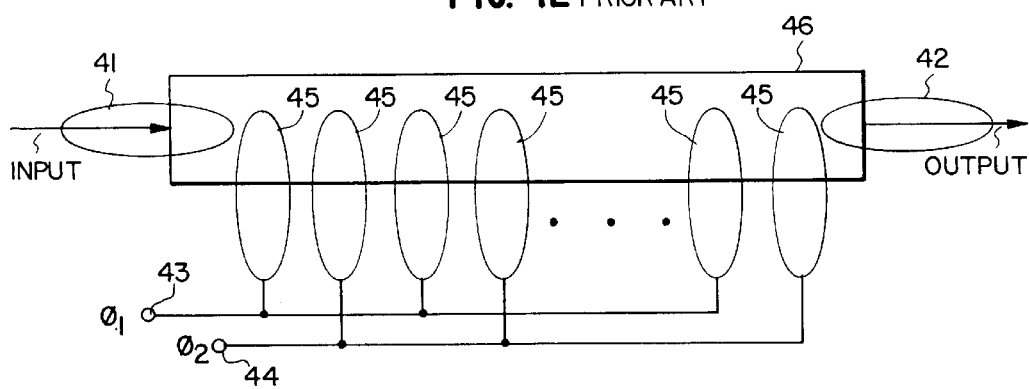
Figure 6:
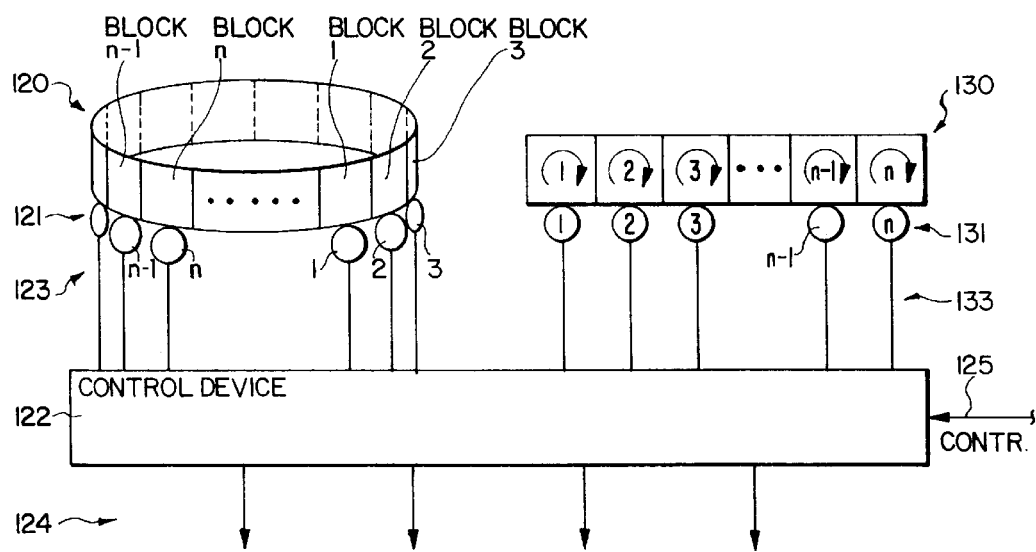
FIG. 6 shows a second alternative structure, in which moving data are accessed by moving portals.

FIG. 6 shows an alternative where the data forming titles 120 and 130 are moving in time in respective data memories. The title 120, subdivided into blocks 1 to n, moves in time much in the same manner as described with respect to FIG. 2. In other words, the data blocks move from one storage sub-unit to the next. The title 130, also subdivided into blocks 1 to n, moves in time within individual storage sub-units. Such an arrangement would exist, for example, if each storage sub-unit were constructed of a recirculating shift register, as described with respect to FIG. 1B. The arrangement of FIG. 6 is shown with one portal 121 or 131 associated with each block of data stored in the respective data memories.

During an output operation of the title 120, the control device 122 activates the portal 121 associated with data block 1 of that title. The data in block 1 travels via signal line 123 to the control device 122, which transfers data block 1 to an output line 124. When the data block 1 has been completely output, the control device 122 will cause the next portal 121 in the programmed output sequence to be read. In this manner, the control device will activate one portal after another, such that the output portal being activated changes with time. Since the data blocks forming title 120 are also moving, the location of the data blocks also changes with time.

In more concrete terms, FIGS. 7A–7D show one possible implementation of the moving data, moving portals alternative. Here, output port 1 (see reference numeral 141) is always associated with memory 1. FIG. 7A shows the configuration of title data 140 relative to output port 1 when the data D1 held in the first cell of the first memory 1 is being output. After the first piece of data D1 is read, the data D1, D9, D17 . . . DN are transferred as shown in FIG. 7B. The "pointer" is moved to the next memory cell in the same memory 1, to read data block D2. FIG. 7C shows the data position after eight read operations, corresponding to D1–D8, have occurred, and the "pointer" has moved completely up the column of cells of memory 1. FIG. 7D shows the device during the next subsequent read operation. Here, the "pointer" is reset to the bottom of the column of data cells of memory 1. Also, by this time, the data forming title 120 has been completely shifted over by one memory. Thus, e.g., the data formerly held in memory 2 is shifted into memory 1, and the data formerly held in memory 1 is shifted into memory N. The "pointer" now begins reading up the column of memory 1 once again, but now reads the next set of data D9–D16. This process continues until the data D1 finally returns to memory 1.

Returning to FIG. 6, an output operation of title 130 proceeds as described with respect to FIGS. 4A–4D. However, here, data blocks 1 to n are moved internally within individual storage sub-units. Thus, according to one concrete example (not illustrated), data stack D1–D8 circulates within memory 1, data stack D9–D16 circulates within memory 2, and so forth.

The data memory in this third alternative can be constructed, e.g., of circulating shift registers, charge coupled devices, or RAM controlled by data sequencers and the like. The control device can be implemented through microprocessors, data sequencers, logic gates, gate arrays, etc.

II. Specific Embodiments of the Invention

As evident from the implementations discussed below, the hardware design options for storing and accessing data according to the present invention can be chosen from a variety of existing technologies. Currently, the most preferable memory device hardware options are various types of semiconductor memory. Advances in technology will surely expand the list of available options.

A. First Embodiment: Shift Registers

Figure 8A:
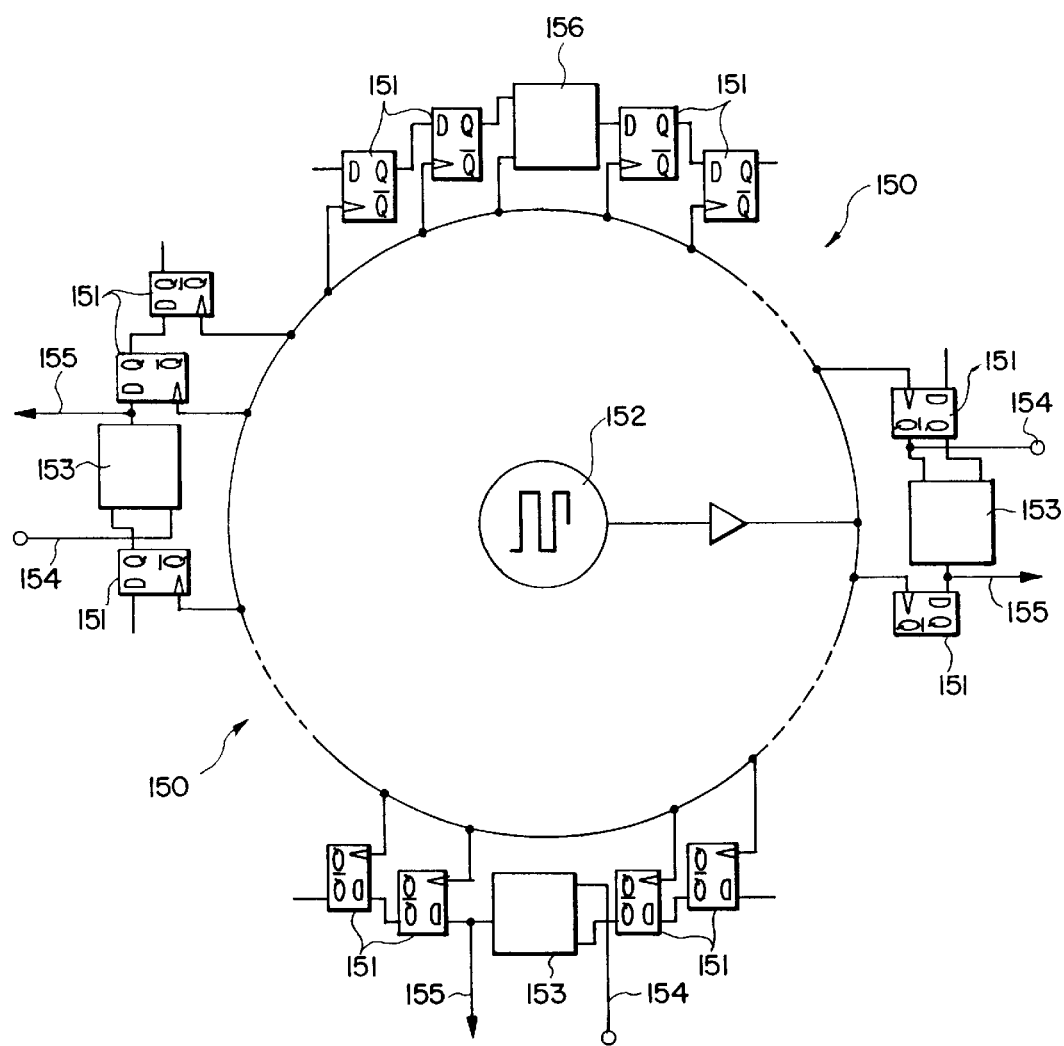

The preferred manner of embodying a memory device using shift registers is shown in FIG. 8A. FIG. 8A shows a long series of clocked shift registers 151 connected to form a ring 150. The ring 150 is constructed such that an entire title is capable of being stored on the ring. Typically, to store a two-hour movie, using MPEG2 as a data compression method, the ring should be able to store approximately 180 Gbits. The ring 150 is clocked by a clock source 152 which governs the rate of circulation of the data around the ring. The ring 150 is preferably clocked at such a rate to deliver (i.e., output) the title at a rate required by the receiver.

If the clock rate required cannot be attained by one shift register, many registers in parallel can be used to obtain the rate required. FIG. 8B illustrates one possible such embodiment in which two parallel rings are constructed, each comprising clocked shift registers 151 connected in series. FIG. 8C illustrates an embodiment in which shift registers 151 are interconnected in series and in parallel to form the ring 150. The rate required is determined largely by the requirements imposed by the service provider.

The data forming the title passes through the shift registers 151 serially as a sequential bit stream. The data is passed from one register 151 to the next in a manner explained in greater detail below.

Figure 8D:
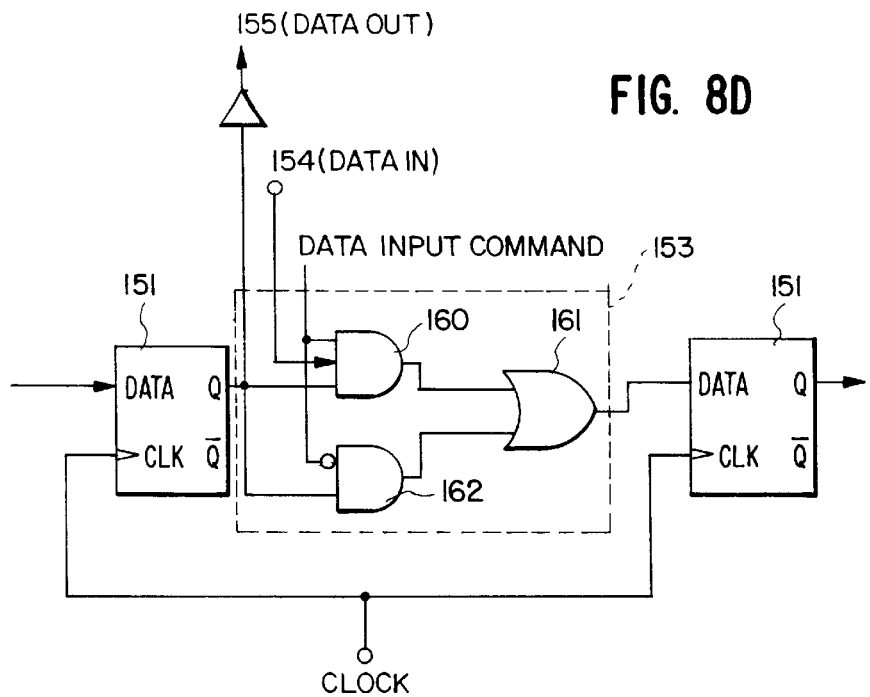

The access to the title stored in the ring 150 is obtained via the data ports 153. An example of a port 153, coupled between two registers 151, is shown in FIG. 8D. As illustrated there, the ports 153 are preferably composed of logic circuitry 160–162. In addition to an input connected to the register 151 preceding it, each port 153 has an input for receiving a bit stream input 154. Data for a new title is inserted into the ring 150 via inputs 154. In addition to an output connected to the following register 151, each port 153 also has an output 155 for copying the bit stream circulating in the ring 150. The number (spacing) of ports 153 included in the ring 150 is based on an efficiency determination, balancing overall cost against access time. The spacing of the ports 153 defines the time intervals between permissible data access, and thus determines, in part, the waiting time between a subscriber request and fulfillment. If the title is accessible in sufficiently small increments, the delay time is imperceptible by humans.

Figure 8E:
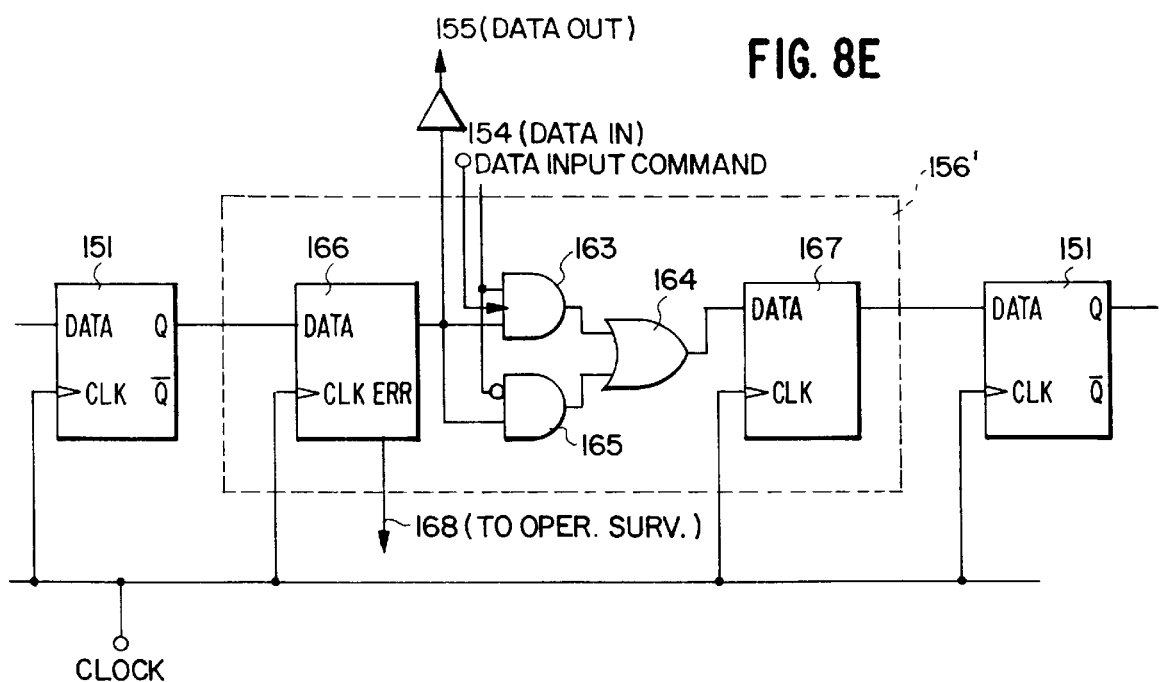

The embodiment of FIG. 8D, described above, has no provision for error correction between registers. As shown in FIG. 8A, regenerators 156 can be inserted periodically in the ring 150 such that the data stream stored in the ring is regenerated as it passes through the regenerator. FIG. 8E shows in greater detail an embodiment in which the regenerator 156 is formed as a data checker 156' inserted between the registers 151. Each data checker 156' preferably contains logic circuitry 163–165 as well as a decoder 166 and an encoder 167. These are preferably a Reed-Solomon decoder and a Reed-Solomon encoder, respectively. The decoder 166 receives the data stream at an input, outputs any errors detected via an output 168, and outputs the decoded data to the logic circuitry 163–165. The output 168 leads to operational surveillance units. Similarly, the data stream is input into the encoder 167 and is output as an encoded data stream to the next following shift register 151. Regeneration occurs as the bit stream passes through the Reed-Solomon decoders/encoders. Thus, errors can be corrected and/or brought to the attention of surveillance equipment.

In addition to error correction, stored data can be processed in other useful ways known to those skilled in the art. Thus, for example, data can be encoded or encrypted. Data would be encoded to provide means to ensure its reliability and to facilitate access to it. Data would be encrypted to prevent unauthorized access to and use of the data.

Further, data may be compressed. Particularly with respect to video information, the repetitive data content of video signals allows for significant reduction in required data storage capacity by use of compression schemes. Such schemes include MPEG, fractal and variable data rate coding. MPEG, currently the most common scheme used in the telecommunications industry, uses a discrete cosine transform and is a lossy compression scheme. MPEG provides a compression ratio of approximately 38:1. Fractal compression techniques, which have only recently become viable, typically provide compression ratios of approximately 1500:1. References describing image compression techniques include W. B Pennebaker et al., JPEG (Reinhold, New York, N.Y., 1993); M. F. Barnsley et al., Fractal Image Compression (A. K. Peters, Wellesley, Mass. 1993); Chiang et al. "Hierarchical Coding of Digital Television", IEEE Communications Magazine, Vol 32, No. 5 (May 1994), pp. 38–45; Pancha et al. "MPEG Coding for Variable Bit Rate Video Transmission", IEEE Communications Magazine, Vol. 32, No. 5 (May 1994), pp. 54–66.

The techniques of encoding, encrypting and data compression just described can be advantageously incorporated into the methods of storing data described in the present application. Thus, if the data stored in the ring is encoded, it can be more efficiently accessed and more reliably stored. By encrypting the data, one provides added security against unauthorized access to and use of the stored data. Finally, data compression provides significant savings in hardware costs, since the storage rings can be constructed of far fewer components.

As such, each ring is structured to allow data to be placed into the ring and copied from the ring. Further, each ring is able to detect and repair errors automatically. If excessive errors arise, this fact is signalled to the surveillance equipment, such that the ring can be taken temporarily out of service and repaired.

The details of construction of the circuitry of the ring 150 are not particularly important in the present invention. The shift registers 151 can be constructed simply of standard logic circuits. The logic family for consideration of shift registers includes Emitter Coupled Logic (ECL), Transistor Transistor Logic (TTL), and Metal Oxide Semiconductor (MOS). The logic family and the approximate memory size of the shift register are shown in the table below.

Shift Register Technology Memory Sizes

| Logic Family | Size In Bits |
| --- | --- |
| ECL | 512 |
| TTL | 1,024 |
| MOS | 1,048,576 |

A memory device according to the first preferred embodiment may be implemented through the utilization of off-the-shelf shift registers. For the purpose of storing and accessing movies and the like, the MOS-type shift register is preferred, due to its larger memory size.

The above embodiment is an example of a memory device in which the data portals are fixed and the stored data stream is moved through the shift registers 151 and through the data portals 153.

B. Second Embodiment: Charge Coupled Devices

Figure 9:
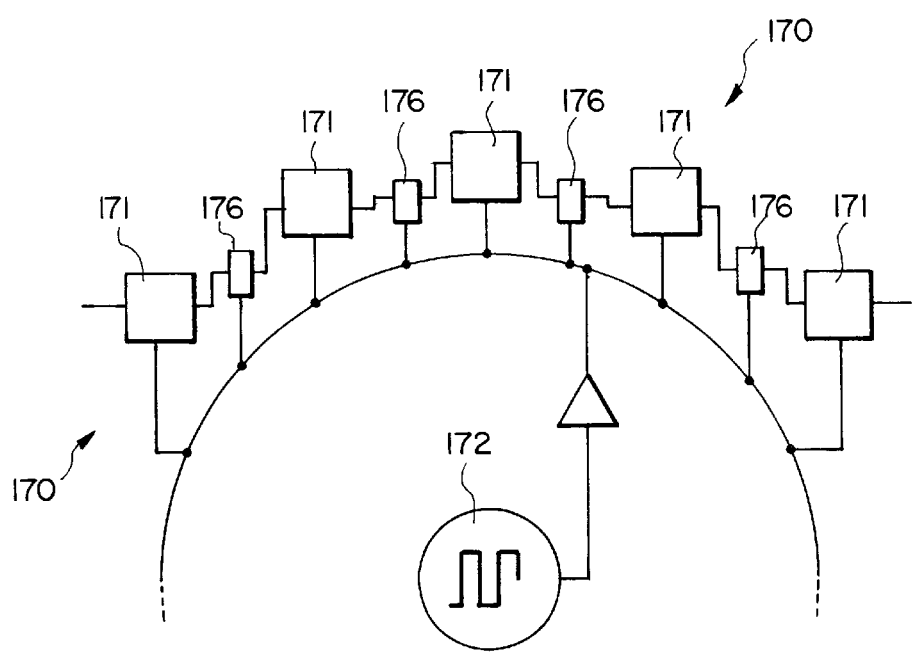
FIG. 9 shows an embodiment of the present invention constructed using CCD technology.

A further, preferred alternative for embodying the memory device is to employ CCDs 171 (Charge-Coupled Devices) as the registers 151, as shown in FIG. 9, to form a ring memory device 170. If the ring 170 is constructed using CCDs 171, then each CCD 171 must be pumped by a clock source 172. Further, some form of regenerating means 176 must be coupled between each CCD 171. Possibilities for the regenerating means 176 include logic gates, as above. The individual CCDs simply function as registers in this embodiment, and the ring memory device 170, overall, functions similarly to the ring memory device 150 described with reference to FIG. 8.

C. Third Embodiment: Delay Lines

Figure 10:
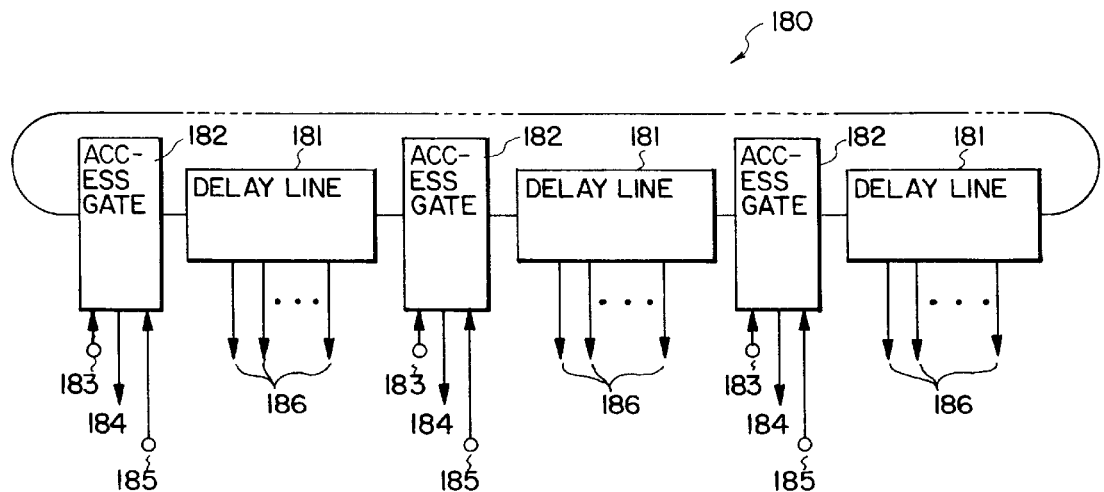
FIG. 10 shows an embodiment of the present invention constructed using delay line technology.

A further implementation of a ring memory device, using delay lines 181 as the storage devices, is shown in FIG. 10. Access gates 182 connect the individual delay lines 181 together. Preferably, the access gates 182 provide data ingress lines 183, data egress lines 184 and access control lines 185. The delay lines 181 themselves are preferably provided with egress ports 186 in addition to those provided at the access gates. In operation, signals transmitted over the access control lines 185 activate the ingress lines 183 or the egress lines 184, thereby allowing data to be input to or output from the ring memory device 180, respectively. If it is desired to output the title via one or more of the additional egress ports 186, appropriate gates at ends of the egress ports 186 are controlled accordingly. Otherwise, operation is analogous to that described with respect to FIG. 8.

D. Fourth Embodiment: Random Access Memories

Figure 11:
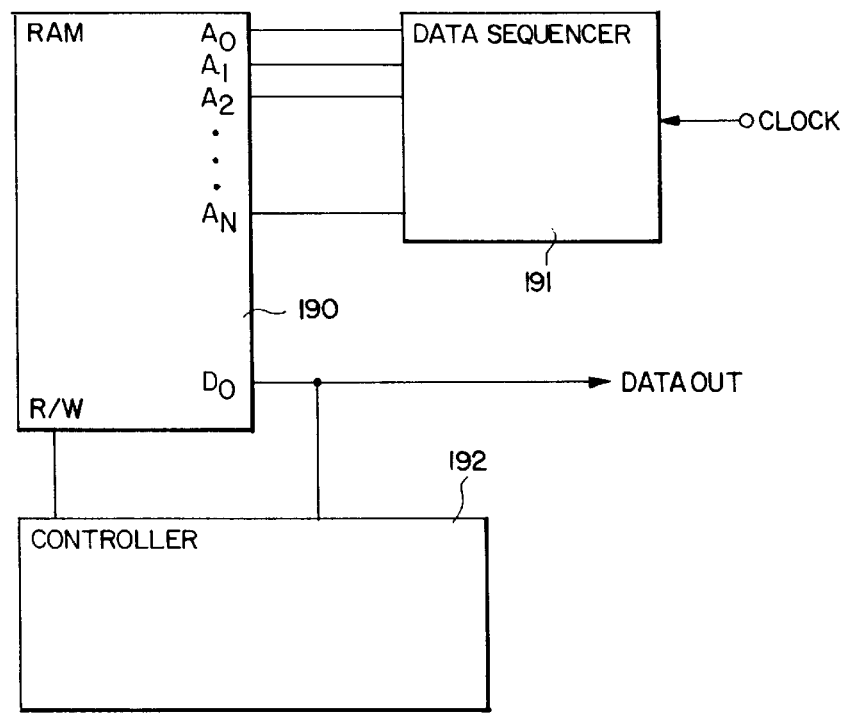
FIG. 11 shows an embodiment of the present invention constructed using RAM technology.

FIG. 11 shows yet another embodiment of the invention, which utilizes one or more random access memories (RAM) to store the data corresponding to a title. As shown, a RAM 190 has a series of address lines A0–AN, a data line D0, and a read/write line R/W. The RAM 190 is connected to a data sequencer 191 on the one hand and a control device 192 on the other hand. In operation, the data sequencer 191 cycles through the address lines A0–AN in accordance with a clock signal input to the data sequencer 191. At the same time, the control device 192 activates the RAM 190 by triggering the line R/W and the data line D0. As a result, the data corresponding to the title stored in the RAM 190 is output in sequential order on the Data Out line. Various alternatives for designing an embodiment utilizing RAM have been described with reference to FIGS. 3–7D, which need not be repeated here.

There are various types of RAM currently on the market which could be used to implement a memory structure as just described. These include Static Random Access Memory (SRAM), Dynamic Random Access Memory (DRAM), and Pseudo Static Random Access Memory (PSRAM). Digital information stored in SRAM is held in "static" locations. Several transistors are required to form a memory cell that represents a binary digit. In order to store 1 million bits of data, a device would need several million transistors. This packing density is achievable today. With respect to DRAM technology, the memory capacity of DRAM devices has dramatically risen over the years. In fact, the memory capacity has attained a level such that construction of a memory device according to the present invention can be achieved readily, using off-the-shelf components. DRAMs require periodic refresh of the data. The periodic refreshing must be performed on a constant basis. As DRAM technology is widely used in the computer industry today, the cost is relatively low in comparison to other technologies. The class of PSRAM memory is a relatively new technology. PSRAM technology represents a combination of the benefits of SRAM and DRAM technology. PSRAM devices have the memory capacity of DRAM devices, yet have an internal refresh capability, making them easy to use. Advances in technology will surely provide additional memory options suited to the present invention.

E. Fifth Embodiment: Storage Medium Confining Waves

Figure 12:
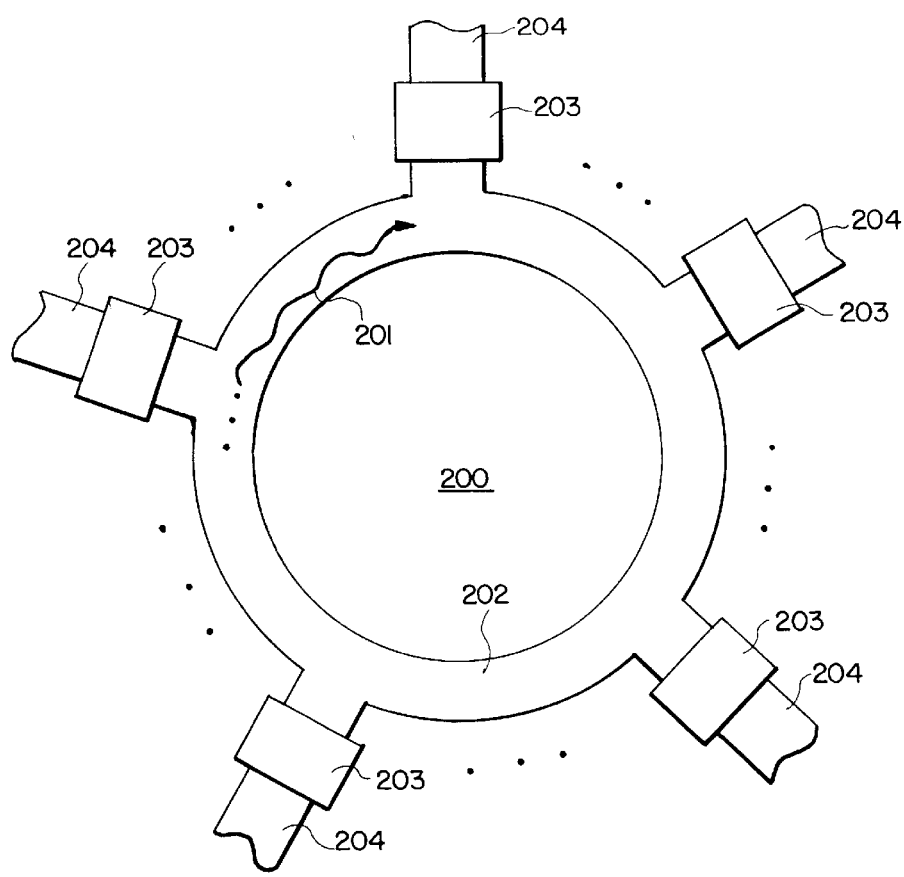
FIG. 12 shows an embodiment of the present invention constructed of a storage medium capable of confining waves that represent data.

FIG. 12 shows an embodiment of the invention which is constructed without the use of individual storage devices. Instead, the memory storage device utilizes a memory storage medium 200 capable of confining cyclically propagating data.

More specifically, the data representing one or more titles, or a portion thereof, is embodied in the form of a propagating wave, where the wave defines the stream of data. In the embodiment shown, the storage medium forms a ring structure, and the wave travels in a circle. The propagating wave can, in theory, be chosen from any known wave phenomenon, e.g., sound, electromagnetic waves including light, microwaves and radio waves, but, preferably light or microwaves are employed. As known, such waves can be used to store information content. Further, such waves, when trapped in a cavity, have the property that they will sustain forward motion. These properties of waves can thus be used to provide data memory for the present invention.

As shown in the figure, a wave 201 representing data is trapped in a ring cavity 202. The speed of propagation is predetermined by the inherent characteristics of the wave and the medium chosen. The type of storage medium chosen is preferably one which minimizes propagation losses. Alternatively, or in addition, the storage medium may be provided with repeaters or other amplifying means (not shown) which compensate for any propagation losses. The list of currently available media for providing such a ring cavity 202 include electrical cable, coaxial cable, reverberation lines, delay lines, fiber-optical cable and microwave cavities.

The ring cavity 202 is associated with a plurality of data portals 203 systematically arranged around the periphery of the ring 200. As discussed in the description of the principle of the invention, the systematic arrangement of portals 203 is one defined by modular arithmetic. The embodiment illustrated has five data portals, with intervals between consecutive portals being equal (although, a commercial embodiment would generally contain a far greater number of portals). Individual portals can be configured either for inputting data, or outputting data, or both. In practice, depending upon the choice of storage medium, portals can be constructed of amplifiers, regenerators, beam splitters, microwave cavity taps, and coaxial cable taps.

In operation, a controller (not shown) is used to select one or more of the portals 203. When selected for data output, a given portal 203 passes the data circulating in the storage medium, in the sequence and at the rate the data appears at the portal. The data output travels along an appropriate exit signal line 204, to be processed and routed to its eventual destination. If the portals are constructed from one of the options listed above, their output is a copy of the data circulating, so that the data wave remains circulating in the ring cavity after output. When data output at a selected portal is complete, the controller may, in appropriate instances, close the portal, so that no further data exits therefrom.

F. Sixth Embodiment: Storage Device Coupled to Output Controller

Figure 13:
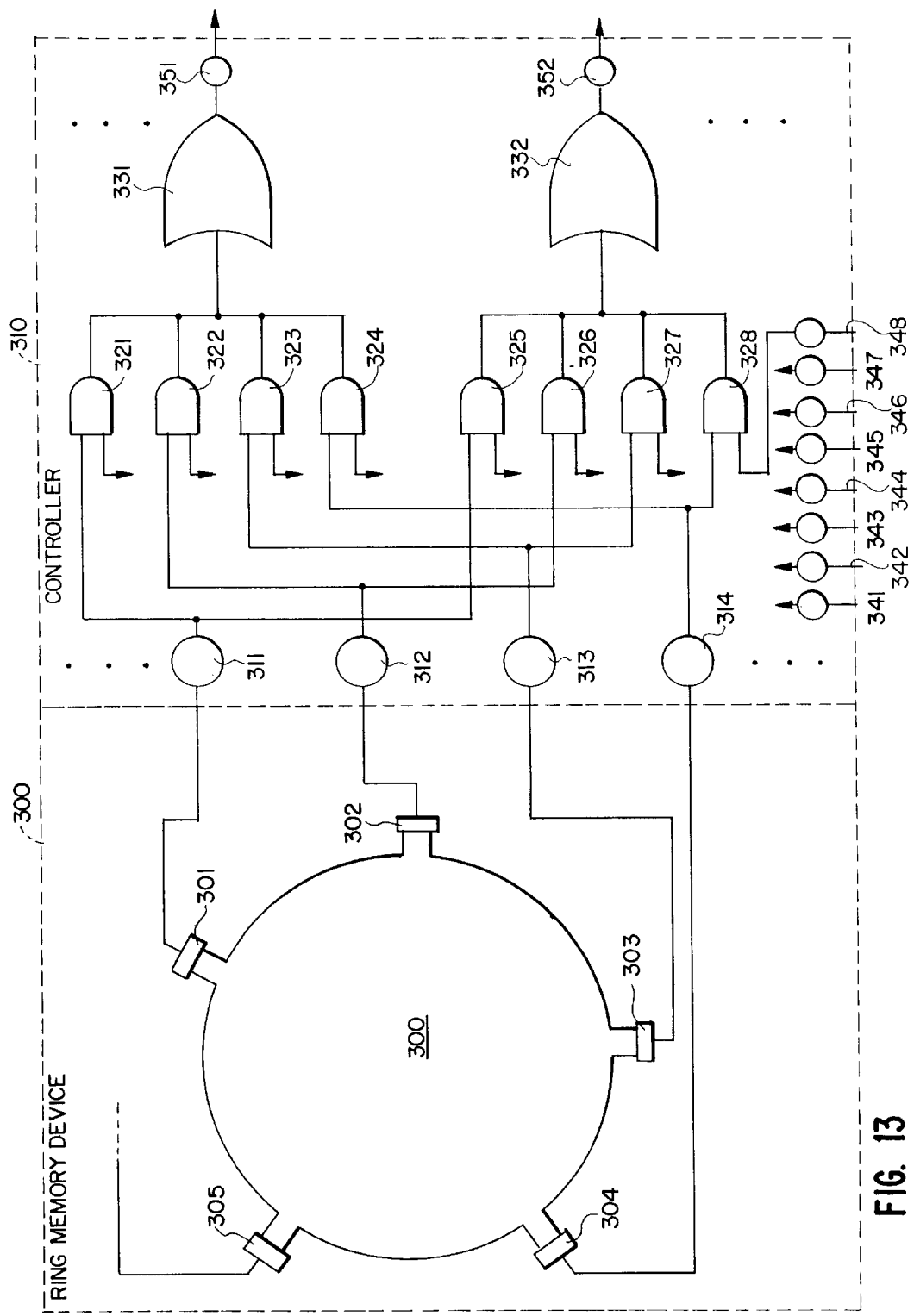
FIG. 13 shows an embodiment of the present invention in which a memory device is coupled to an output controller.

FIG. 13 shows a memory device with further details regarding portal selection. This embodiment is again an example of a memory device 300 provided with a plurality of fixed access portals 301–305 and with a capability of storing a moving data stream. Data can be placed into the device 300 or copied out, as required. The present discussion will focus on data output. The internal portals 301–305 are connected to a controller 310, with each portal 301–305 being associated with one input 311–314 to the controller 310. The controller 310 provides the selection and switching operability required to output the stored data stream to external signal lines, via output points 351–352.

More specifically, logic circuitry, including AND gates 321–328 and OR gates 331–332, connects the controller inputs 311–314 to the controller output points 351–352. Each AND gate 321–328 has a first input originating at the input 311–314 and a second input constituting a selection line from one of a group of selectors 341–348. Further, each AND gate 321–328 has one output line that forms an input into one of the OR gates 331–332. As shown, each OR gate 331–332 receives inputs from a number of AND gates 321–328. The number of AND gates 321–328 and the number of OR gates 331–332 is determined by the number of desired controller inputs 311–314 and desired controller output points 351–352, as shown.

In a given output operation, a signal from a given selector, e.g., 341, triggers a corresponding AND gate 321. The activated AND gate 321 then permits the data stream from its associated output portal 301 to pass through. The selection signal 341 is chosen to synchronize with the circulating data stream. Thus, if the title is to be output from its beginning, the portal is selected to be able to "capture" the data stream from its beginning. (If title playback is to commence from some other point, e.g., after a pause operation, the portal is again selected accordingly to "capture" the data stream from the other point.) Then, the data stream flows out from the portal 301 and through the appropriate AND gate 321. The data stream then appears at the corresponding input to one of the OR gates 331, where it is passed through to the controller output point 351.

Either simultaneously or at any time thereafter, a second selection signal can prompt a second output operation. Thus, for example, in a simultaneous output operation (or one corresponding to the modulus of the ring), a second AND gate 325 that is connected to the same portal 301 as the one activated in the first output operation is triggered by a further selection signal 345 to forward the data stream. On the other hand, in an output operation occurring later in time but before the first output operation is completed, a second AND gate, e.g., 327, connected to a different portal, e.g., 303, is activated by a selection signal, e.g., 347. As in the first output operation, the choice of the AND gate 327 and the portal 303 is determined by the momentary location of the starting point of the data stream in the ring 300.

Figure 14:
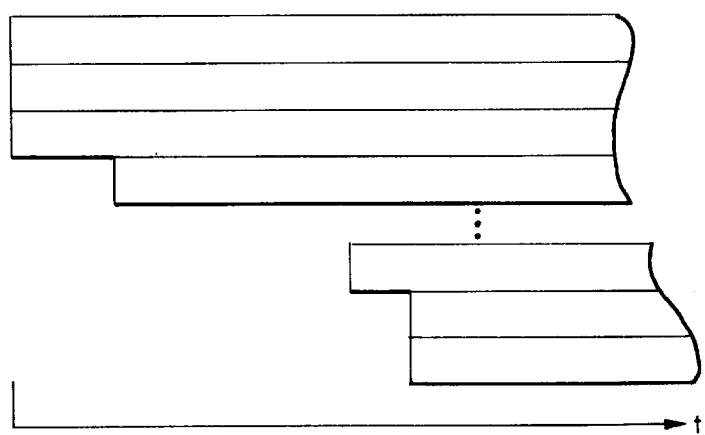
FIG. 14 illustrates a data output scenario, where stored data is supplied to various subscribers.

Given a sufficient number of portals 301–305 and output points 351–352, the data stream stored in the memory 300 can be output to multiple destinations in a multi-overlapped manner. Overlaps, as just described, can either be complete or be partial. FIG. 14 illustrates one output scenario. As shown, requests from subscribers A, B and C give rise to simultaneous, completely overlapping, response outputs. Only one output portal, e.g., 301, need be activated to respond to these three requests. The request from subscriber D is somewhat delayed in time, however, so that the appropriate response output is staggered relative to the response for subscribers A, B and C. Thus, the controller 310 selects a different portal in the ring to respond to the request from subscriber D. Requests from additional subscribers X, Y and Z are handled in like manner.

In summary, the various data storage systems disclosed allow a wide assortment of titles (e.g., movies, educational-, entertainment-, consumer-, and business-related information, and any information that can be converted into a stream of data) to be stored and retrieved by a wide audience with great flexibility and minimal contention between users for the titles offered.

The above description of the preferred embodiments has been given by way of example. From the disclosure given, those skilled in the art will not only understand the present invention and its attendant advantages, but will also find apparent various changes and modifications that can be made to the methods and structures disclosed. It is sought, therefore, to cover all such changes and modifications as fall within the spirit and scope of the invention, as defined by the appended claims, and equivalents thereof.

We claim:

1. A memory device comprising:

a data storage unit storing data in a systematic arrangement;

a plurality of data portals arranged in a manner defined by modular arithmetic and connected to said data storage unit;

means for establishing relative, systematic, cyclical movement between the data stored in said data storage unit and said data portals; and means for determining a location of the data relative to said data portals at a given time based on the movement between the data and said data portals;

wherein said data portals are logical locations.

2. A memory device comprising:

a digital data storage unit having a systematic arrangement of logical data locations for storing data;

a plurality of data portals arranged in a manner defined by modular arithmetic and each provided for accessing said data locations;

means for establishing systematic, cyclical, relative movement between said data locations and said data portals; and means for selecting at least one of said data portals based on said one data portal providing access to a desired one of said data locations.

3. A memory device comprising:

a data storage unit for storing data in a systematic arrangement;

a systematic arrangement of plural data outputs connected to said data storage unit;

means for establishing relative, systematic, cyclical movement between the data stored in said data storage unit and said data outputs; and means for determining a momentary location of the data relative to said data outputs based on the movement between the data and said data outputs;

wherein said data outputs are logical locations.

4. A memory device comprising:

a digital data storage unit having a systematic arrangement of logical data locations for storing data;

a systematic arrangement of plural data outputs each provided for accessing said data locations;

means for establishing systematic, cyclical, relative movement between said data locations and said data outputs; and means for selecting at least one of said data outputs.

5. A memory device comprising:

a digital data storage unit having a systematic arrangement of logical data locations for storing data;

a systematic arrangement of plural data portals each provided for accessing said data locations;

a generator producing systematic, cyclical, relative movement between said data locations and said data portals; and a controller selecting at least one of said data portals in accordance with an input command and a calculation based on the relative movement.

* * * * *